(12) United States Patent
Korgel et al.

(10) Patent No.: US 11,222,989 B2
(45) Date of Patent: Jan. 11, 2022

(54) PHOTONIC CURING OF NANOCRYSTAL FILMS FOR PHOTOVOLTAICS

(71) Applicant: Board of Regents, The University of Texas System, Austin, TX (US)

(72) Inventors: Brian A. Korgel, Round Rock, TX (US); Taylor B. Harvey, Austin, TX (US); Carl Jackson Stolle, Austin, TX (US); Vahid Akhavan, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 16/789,871

(22) Filed: Feb. 13, 2020

(65) Prior Publication Data
US 2020/0259028 A1    Aug. 13, 2020

Related U.S. Application Data

(63) Continuation of application No. 15/509,075, filed as application No. PCT/US2015/049858 on Sep. 12, 2015, now Pat. No. 10,593,821.

(Continued)

(51) Int. Cl.
*H01L 31/00* (2006.01)
*H01L 31/0445* (2014.01)
(Continued)

(52) U.S. Cl.
CPC .... *H01L 31/0445* (2014.12); *H01L 21/02422* (2013.01); *H01L 21/02485* (2013.01);
(Continued)

(58) Field of Classification Search
CPC ......... H01L 21/02601; H01L 21/02628; H01L 31/1864; H01L 31/0445; Y02E 10/541
See application file for complete search history.

(56) References Cited

U.S. PATENT DOCUMENTS 8,410,712 B2   4/2013   Schroder et al.
8,557,642 B2   10/2013  Schroder et al.
(Continued)

FOREIGN PATENT DOCUMENTS

WO    2016040913 A2    3/2016

OTHER PUBLICATIONS

Akhavan et al., "Spray-deposited CuInSe2 nanocrystal photovoltaics," Energy Environ. Sci., 2010, 3, 1600-1606 (Year: 2010).*
(Continued)

*Primary Examiner* — Angelo Trivisonno
(74) *Attorney, Agent, or Firm* — Kilpatrick Townsend & Stockton LLP

(57) ABSTRACT

Methods of making a semiconductor layer from nanocrystals are disclosed. A film of nanocrystals capped with a ligand can be deposited onto a substrate; and the nanocrystals can be irradiated with one or more pulses of light. The pulsed light can be used to substantially remove the ligands from the nanocrystals and leave the nanocrystals unsintered or sintered, thereby providing a semiconductor layer. Layered structures comprising these semiconductor layers with an electrode are also disclosed. Devices comprising such layered structures are also disclosed.

17 Claims, 21 Drawing Sheets

Related U.S. Application Data

(60) Provisional application No. 62/049,891, filed on Sep. 12, 2014.

(51) Int. Cl.

| | |
|---|---|
| *H01L 31/0296* | (2006.01) |
| *H01L 21/02* | (2006.01) |
| *H01L 31/0352* | (2006.01) |
| *H01L 31/0224* | (2006.01) |
| *H01L 31/0232* | (2014.01) |
| *H01L 31/028* | (2006.01) |
| *H01L 31/032* | (2006.01) |
| *H01L 31/18* | (2006.01) |
| H01L 31/0256 | (2006.01) |

(52) U.S. Cl.
CPC .. *H01L 21/02491* (2013.01); *H01L 21/02502* (2013.01); *H01L 21/02562* (2013.01); *H01L 21/02568* (2013.01); *H01L 21/02601* (2013.01); *H01L 21/02628* (2013.01); *H01L 31/028* (2013.01); *H01L 31/0296* (2013.01); *H01L 31/02327* (2013.01); *H01L 31/022425* (2013.01); *H01L 31/022466* (2013.01); *H01L 31/0322* (2013.01); *H01L 31/0326* (2013.01); *H01L 31/035209* (2013.01); *H01L 31/1864* (2013.01); *H01L 2031/0344* (2013.01)

(56) References Cited

U.S. PATENT DOCUMENTS

| | | |
|---|---|---|
| 10,593,821 B2 | 3/2020 | Korgel et al. |
| 2010/0025595 A1 | 2/2010 | Bawendi et al. |
| 2010/0240901 A1 | 9/2010 | Bulovic et al. |
| 2011/0017017 A1 | 1/2011 | Pak et al. |
| 2011/0056564 A1 | 3/2011 | Korgel et al. |
| 2011/0245533 A1 | 6/2011 | Breen et al. |

OTHER PUBLICATIONS

Novacentrix, "PulseForge 3300," accessible at <https://web.archive.org/web/20120619080901/https://www.novacentrix.com/products/pulseforge/3300> (Year: 2012).*
Lundberg et al., "The effect of Ga-grading in CIGS thin film solar cells" Thin Solid Films 480-481 (2005) 520-525 (Year: 2005).*
Hillhouse ("Solar cells from colloidal nanocrystals: Fundamentals, materials, devices, and economics") (Year: 2009).*
Stolle ("Nanocrystal photovoltaics: a review of recent progress") (Year: 2013).*
Panthani ("Synthesis of CuInS2, CuInSe2, and Cu(InxGa1-x)Se2 (CIGS) Nanocrystal 'Inks' for Printable Photovoltaics") (Year: 2008).*
Abou-Ras, et. al., "Formation and Characterisation of MoSe$_2$ for Cu(In,Ga)Se$_2$ Based Solar Cells", Thin Solid Films 2005, 480-481, 433-438.
Akhavan, et. al., "Colloidal CIGS and CZTS Nanocrystals: A Precursor Route to Printed Photovoltaics", J. Solid State Chem. 2012, 189, 2-12.
Akhavan, et. al., "Thickness-Limited Performance of CuInSe$_2$ Nanocrystal Photovoltaic Devices", Opt. Express, 2010, 18, A411-A420.
Akhavan, et. al., "Influence of Composition on the Performance of Sintered Cu(In,Ga)Se$_2$ Nanocrystal Thin-Film Photovoltaic Devices", Chem. Sus. Chem. 2013, 6, 481-486.
Barkhouse, et. al., "Thiols Passivate Recombination Centers in Colloidal Quantum Dots Leading to Enhanced Photovoltaic Device Efficiency," ACS Nano 2:2356-2362, 2008.
Baumgardner, et.. al., "Pulsed Laser Annealing of Thin Films of Self-Assembled Nanocrystals", ACS Nano 2011, 5, 7010-7019.
Bhattacharyya, et. al., "Detection of Binary Phases in CuInSe$_2$ Films Formed by Laser Annealing of Stacked Elemental Layers of In, Cu and Se", J. Mater. Sci. 1996, 31, 5451-5456.
Beard. et. al., "Multiple Exciton Generation in Colloidal Silicon Nanocrystals," Nano Lett. 7:2506-2512, 2007.
Beard, et. al., "Multiple Exciton Generation in Semiconductor Quantum Dots," J Phys. Chem. Lett. 2: 1282-1288, 2011).
Chen, e.t al., "Solvothermal Synthesis and Characterization of Chalcopyrite CuInSe$_2$ Nanoparticles", Nanoscale Res. Lett. 2010, 5:217-223.
Califano, et. al., "Direct and Inverse Auger Processes in InAs Nanocrystals: Can the Decay Signature of a Trion Be Mistaken for Carrier Multiplication?" ACS Nano 3:2706-2714, 2009).
Castro, et. al., "Nanocrystalline Chalcopyrite Materials (CuinS2 and CuInSe2) via Low-Temperature Pyrolysis of Molecular Single-Source Precursors," Chem. Mater. 15:3142-3147, 2003).
Congreve, et. al., "External Quantum Efficiency Above 100% in a Singlet-Exciton-Fission-Based Organic Photovoltaic Cell," Science 340:334-337, 2013).
Demtsu. et. al., "Role of Copper in the Performance of CdS/CdTe Solar Cells," Conference Record of the 2006 IEEE 4th World Conference on Photovoltaic Energy Conversion; 2006; vol. 1, pp. 523-526.
Dhage, et. al., "Cu(In,Ga)Se2 Thin Film Preparation from a Cu(In,Ga) Metallic Alloy and Se Nanoparticles by an Intense Pulsed Light Technique". J Electron Mater. 2011, 40, 122-126).
Dhage, et. al. "Rapid Treatment of CIGS Particles by Intense Pulsed Light", Journal of Physics and Chemisty Solids 71, 2010, 1480-1483.
Franz,I et. al., "Fast Energy Transfer in Layer-bylayer Assembled CdTe Nanocrystal Bilayers," Appl. Phys. Lett. 84:2904-2906, 2004.
Gabor, et. al., "Extremely Efficient Multiple Electron-Hole Pair Generation in Carbon Nanotube Photodiodes," Science 325:1367-1371, 2009).
Ghosh, et. al., "A Novel Back-contacting Technology for Thin Films", Semicond. Sci. Technol. 1996, 11, 1358.
Gloeckler, et. al., "Apparent Quantum Efficiency Effects in CdTe Solar Cells," J Appl. Phys. 95:4438-4445, 2004).
Guo,, et. al., "Ink Formulation and Low-temperature Incorporation of Sodium to Yield 12% Efficient Cu(In,Ga)(S,Se)$_2$ Solar Cells from Sulfide Nanocrystal Inks", Progress in Photovoltaics: Research and Applications 2013, 1, 64-71.
Guo, et. al., "Fabrication of 7.2% Efficient CZTSSe Solar Cells Using CZTS Nanocrystals," J Am. Chem. Soc., 132(49):17384-17386, 2010).
Hanna, et. al., "Solar Conversion Efficiency of Photovoltaic and Photoelectrolysis Cells with Carrier Multiplication Absorbers," J Appl. Phys. 100:074510, 2006.
Harvey, et. al., "Copper Indium Gallium Selenide (CIGS) Photovoltaic Devices Made Using Multistep Selenization of Nanocrystal Films", ACS Appl. Mater. Interfaces, 2013, 5(18), 9134-9140.
Hegedus, et. al., "Photoconductive CdS: How Does It Affect CdTe/CdS Solar Cell Performance?" MRS Online Proc. Libr. 763 :B9.5.I-B9.5.6, 2003).
Hegedus et al., "The Photoresponse of CdS/CuInSe2 Thin-Film Heterojunction Solar Cells," IEEE Trans. Electron Devices, 31:629-633, 1984.
Henry, et. al., "Limiting Efficiencies of Ideal Single and Multiple Energy Gap Terrestrial Solar Cells," J Appl. Phys. 51 :4494-4500, 1980).
Hillhouse, e.t al., "Solar Cells from Colloidal Nanocrystals: Fundamentals, Materials, Devices, and Economics", Current Opinion in Colloid & Interface Sci. 2009, 14, 245-259.
International Preliminary Report on Patentability issued in International Application No. PCT/US2015/49858, dated Mar. 23, 2017, all pgs.
International Search report and Written Opinion issued in International Application No. PCT/US2015/49858, dated Nov. 16, 2016, all pgs.
Ip, et. al. "Hybrid Passivated Colloidal Quantum Dot Solids", Nature Nanotech, 2012, 7, 577-582.
Jackson, et,. al., "New World Record Efficiency for Cu(In,Ga)Se2 Thin-film Solar Cells Beyond 20%," Frog. Photovoltaics Res. Appl. 19:894-897, 2011.

(56) References Cited

OTHER PUBLICATIONS

Jasieniak, et. al., "Solution-Processed Sintered Nanocrystal Solar Cells via Layer-by-Layer Assembly", Nano Lett. 2011, 11, 2856-2864.
Jiang, et. al., "Soluble Precursors for CuInSe2, CuIn1-xGaxSe2, and Cu2ZnSn(S,Se)4 Based on Colloidal Nanocrystals and Molecular Metal Chalcogenide Surface Ligands," J. Am. Chem. Soc. 2012, 134, 5010-5013 (Year: 2012).
Kim, et. al., "Carrier Multiplication in a PbSe Nanocrystal and P3HT/PCBM Tandem Cell," Appl. Phys. Lett. 92: 191107-191107-3, 2008.
Kim, et. al., "Multiple Exciton Generation and Electrical Extraction from a Pb Se Quantum Dot Photoconductor," Appl. Phys. Lett. 92:031107-031107-3, 2008.
Kohara, et. al., "Electrical Properties of the Cu(In,Ga)$Se_2$/ $MoSe_2$/ Mo Structure", Solar Energy Materials and Solar Cells 2001, 67, 209-215.
Konstantatos, et. al., "Engineering the Temporal Response of Photoconductive Photodetectors via Selective Introduction of Surface Trap States," Nano Lett. 8:1446-1450, 2008).
Koo, et. al., "Wurtzite-Chalcopyrite Polytypism in $CuInS_2$ Nanodisks", Chem. Mater. 2009, 21, 1962-1966.
Kovalenko, et. al., "Colloidal Nanocrystals with Molecular Metal Chalcogenide Surface Ligands", Science 2009, 324, 1417-1420.
Lazarenkova, et. al., "Miniband Formation in a Quantum Dot Crystal," J Appl. Phys. 2001, 89, 5509-5515.
Lin, et. al., "Size Dependence of the Multiple Exciton Generation Rate in CdSe Quantum Dots," ACS Nano 5:2503-2511, 2011.
Luther, et. al., "Multiple Exciton Generation in Films of Electronically Coupled PbSe Quantum Dots," Nano Lett. 7: 1779-1784, 2007.
Lee, e.t al., "Pulsed Light Sintering Characteristics of Inkjet-printed Nanosilver Films on a Polymer Substrate", J. Micromech. Microeng. 2011, 21, 125023.
MacDonald, et. al., "Layer-by-Layer Assembly of Sintered $CdSe_xTe_{1-x}$ Nanocrystal Solar Cells", ACS Nano 2012, 6, 5995-6004.
Munn, et. al., "Fabrication of CZTS Based Thin Film Solar Cells using an All-Solution Process and Pulsed Light Crystallization", SPIE 2013, 8691, 6 pages.
McGuire, et. al., "Apparent Versus True Carrier Multiplication Yields in Semiconductor Nanocrystals," Nano Lett. 10:2049-2057, 2010).
Murphy, et. al., "PbTe Colloidal Nanocrystals: Synthesis, Characterization, and Multiple Exciton Generation," J Am. Chem. Soc. 128:3241-3247, 2006.
Murray, et. al., "Flexible solar cells in milliseconds: Pulse Thermal Processing of CdTe devices", In 2011 37th IEEE Photovoltaic Specialists Conference (PVSC) June; pp. 003327-003329.
Norako, et. al., "Synthesis of Metastable Wurtzite $CuInSe_2$ Nanocrystals", Chem. Mater. 2010, 22, 1613-1615.
Norako, et. al., "Growth Kinetics of Monodisperse Cu—In—S Nanocrystals Using a Dialkyl Disulfide Sulfur Source", Chem. Mater. 2009, 21, 4299-4304.
Panthani, et. al., "$CuInSe_2$ Quantum Dot Solar Cells with High Open-Circuit Voltage", JPC Lett. 2013, 2030-2034.
Panthani, et. al., "Synthesis of $CuInS_2$, $CuInSe_2$, and $Cu(In_xGa_{1-x})Se_2$ (CIGS) Nanocrystal 'Inks' for Printable Photovoltaics", J. Am. Chem. Soc., 2008, 130(49), 16770-16777.
Panthani, et. al., "High Efficiency Solution Processed Sintered CdTe Nanocrystal Solar Cells: The Role of Interfaces," Nano Lett., Dec. 2013).
Park, et. al., "$CuInSe_2$ Phase Formation During $Cu_2Se/In_2Se_3$ Interdiffusion Reaction", J. Appl. Phys. 2000, 87, 3683-3690.
Sambur, et. al., "Multiple Exciton Collection in a Sensitized Photovoltaic System," Science 330:63-66, 2010).
Sandeep, et. al., "High Charge-carrier Mobility Enables Exploitation of Carrier Multiplication in Quantum-dot Films," Nat. Commun. 4:2360, 2013).
Schaller, et. al., "High Efficiency Carrier Multiplication in Pb Se Nanocrystals: Implications for Solar Energy Conversion," Phys. Rev. Lett. 92: 186601, 2004.
Schroder, "Mechanisms of Photonic Curing: Processing High Temperature Films on Low Temperature Substrates", Nanotech 2011: Electronics, Devices, Fabrication, MEMS, Fluidics and Computational, Chapter 4, vol. 2, 2011, pp. 220-223.
Semonin, et. al., "Peak External Pholocurrent Quantum Efficiency Exceeding 100% via MEG in a Quantum Dot Solar Cell", Science 2011, 334, 1530-1533.
Stewart, et. al., "Comparison of Carrier Multiplication Yields in PbS and Pb Se Nanocrystals: The Role of Competing Energy-Loss Processes," Nano Lett. 12:622-628, 2012.).
Singh, et. al., "Photonic Sintering of Thin Film Prepared by Dodecylamine Capped CuInxGa1—xSe2 Nanoparticles for Printed Photovoltaics", Thin Solid Films 2014, 33 pages.
Sites, et al., "Analysis of Apparent Quantum Efficiency," Sol. Cells 29:39-48, 1990).
Steinhagen, et al., "Solution-Liquid-Solid Synthesis of $CuInSe_2$ Nanowires and Their Implementation in Photovoltaic Devices", ACS Appl. Mater. Interfaces 2011, 3, 1781-1785.
Stolle, et. al., "Nanocrystal Photovoltaics: A Review of Recent Progress", Current Opinion in Chem. Eng. 2013, 2, 160-167.
Stolle, et. al., "Comparison of the Photovoltaic Response of Oleylamine and Inorganic Ligand-Capped $CuInSe_2$ Nanocrystals", ACS Appl. Mater. Interfaces 2012, 4, 2757-2761.
Stolle, et. al., J Phys. Chem. Lett.,5(2):304-309, 2014). "Multiexciton Solar Cells of CuInSe2 Nanocrystals", Dec. 2013.
Sukhovatkin, et al., "Colloidal Quantum-Dot Photodetectors Exploiting Multi exciton Generation," Science 324: 1542-1544, 2009.
Tisdale, et. al., "Hot-Electron Transfer from Semiconductor Nanocrystals," Science 328: 1543-1547, 2010).
Trinh, et. al., "Direct Generation of Multiple Excitons in Adjacent Silicon Nanocrystals Revealed by Induced Absorption." Nat. Photonics 6:316-321, 2012.
Wang, et. al., "Synthesis of Monodispersed Wurtzite Structure $CuInSe_2$ Nanocrystals and Their Application in High-Performance Organic-Inorganic Hybrid Photodetectors", J. Am. Chem. Soc. 2010, 132, 12218-12221.
Wang, et. al., "Investigation of Pulsed Non-melt Laser Annealing on the Film Properties and Performance of $Cu(In,Ga)Se_2$ Solar Cells", Solar Energy Materials and Solar Cells 2005, 88, 65-73.
Wang, et. al., "Investigation of Rapid Thermal Annealing on $Cu(In,Ga)Se_2$ Films and Solar Cells", Solar Energy Materials and Solar Cells 2006, 90, 2855-2866.
Zhu, et. al., "Determining Factor of $MoSe_2$ Formation in $Cu(In,Ga)Se_2$ Solar Cells", Solar Energy Materials and Solar Cells 2012, 101, 57-61.

* cited by examiner

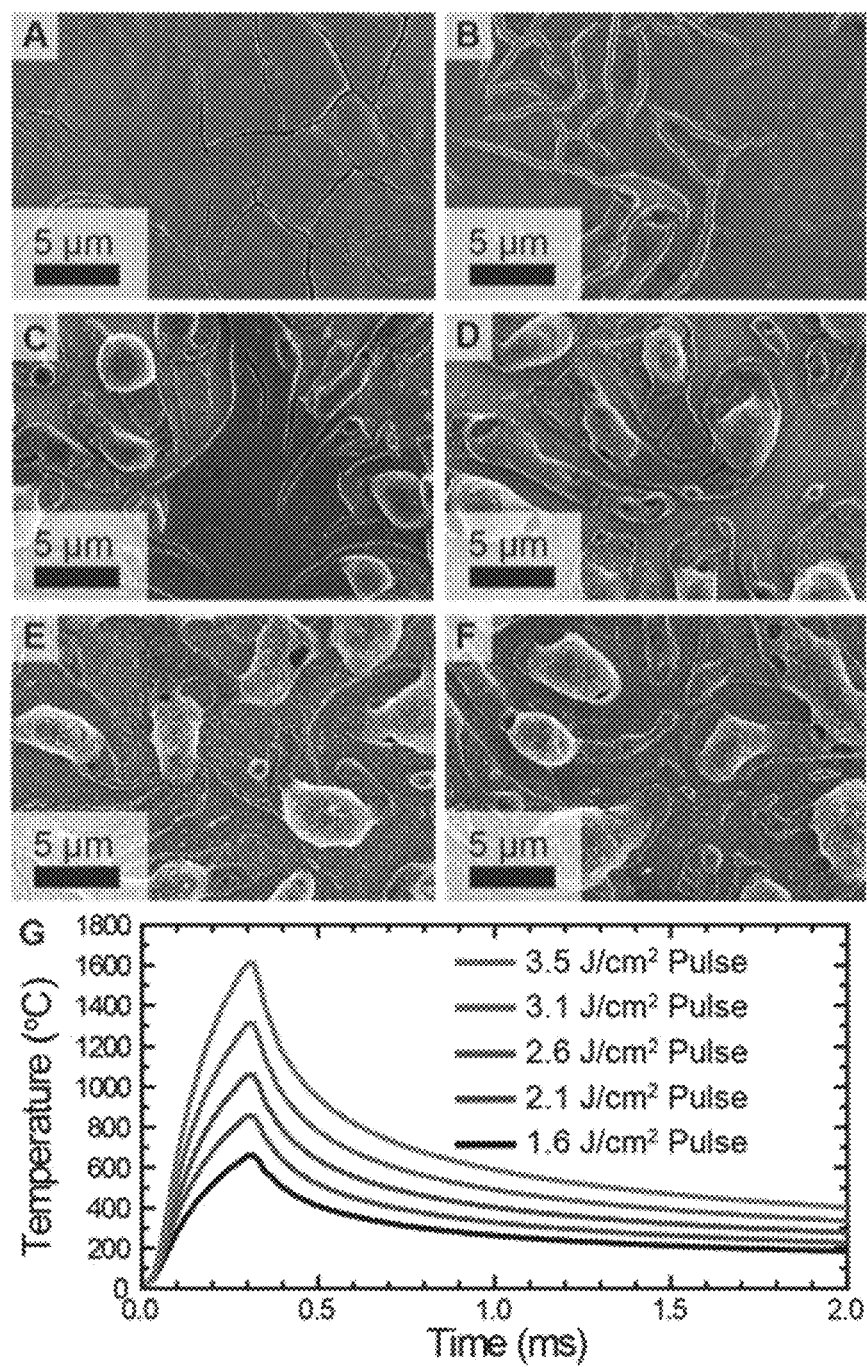
FIG. 1A-G

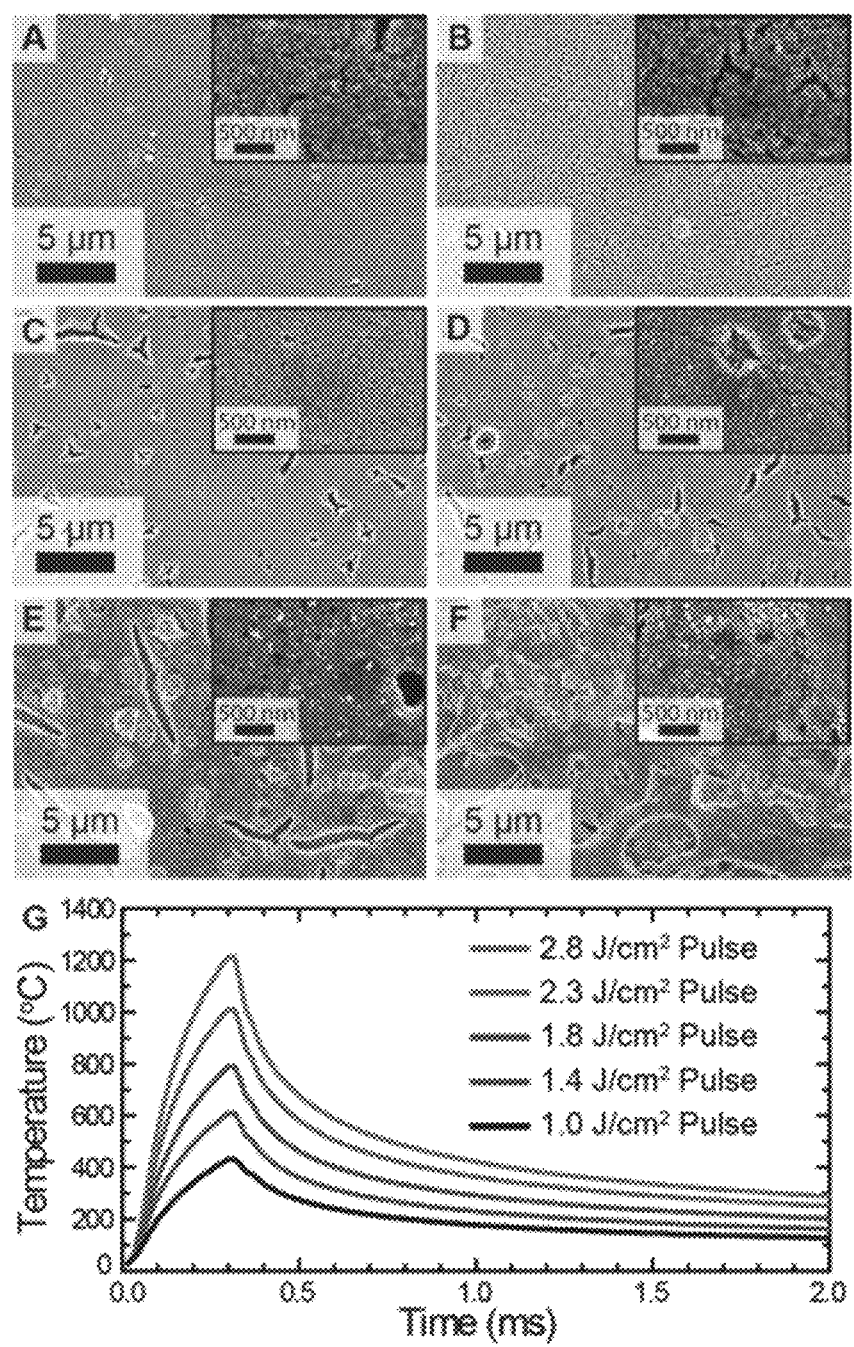
FIG. 2A-G

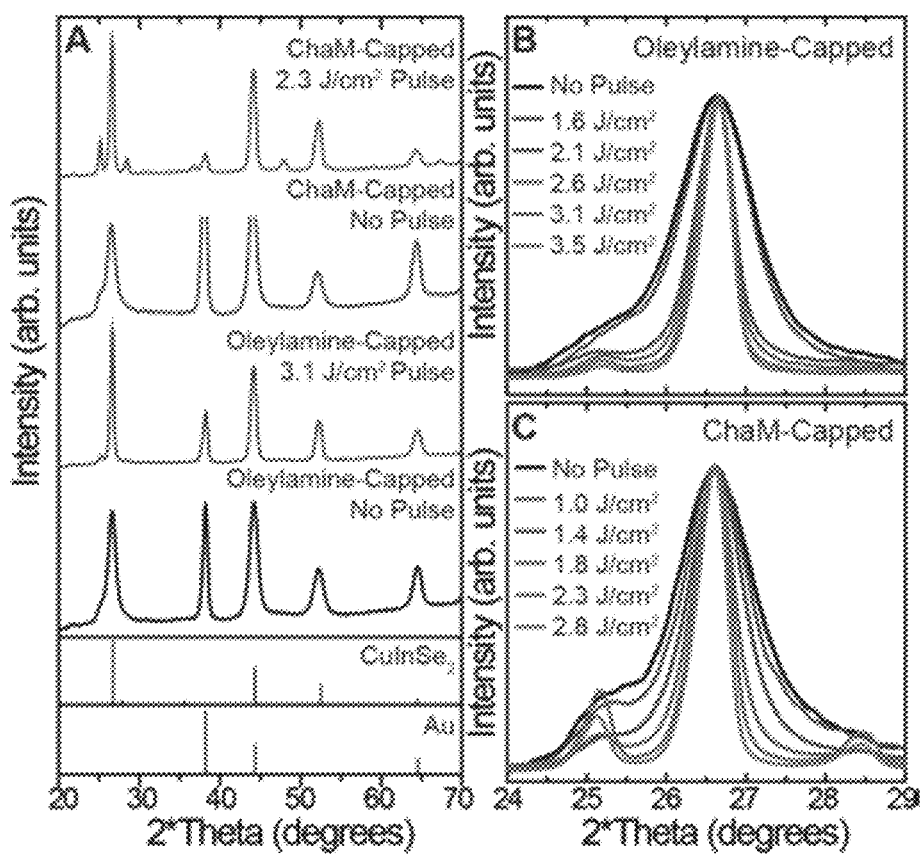
FIG. 3A-C

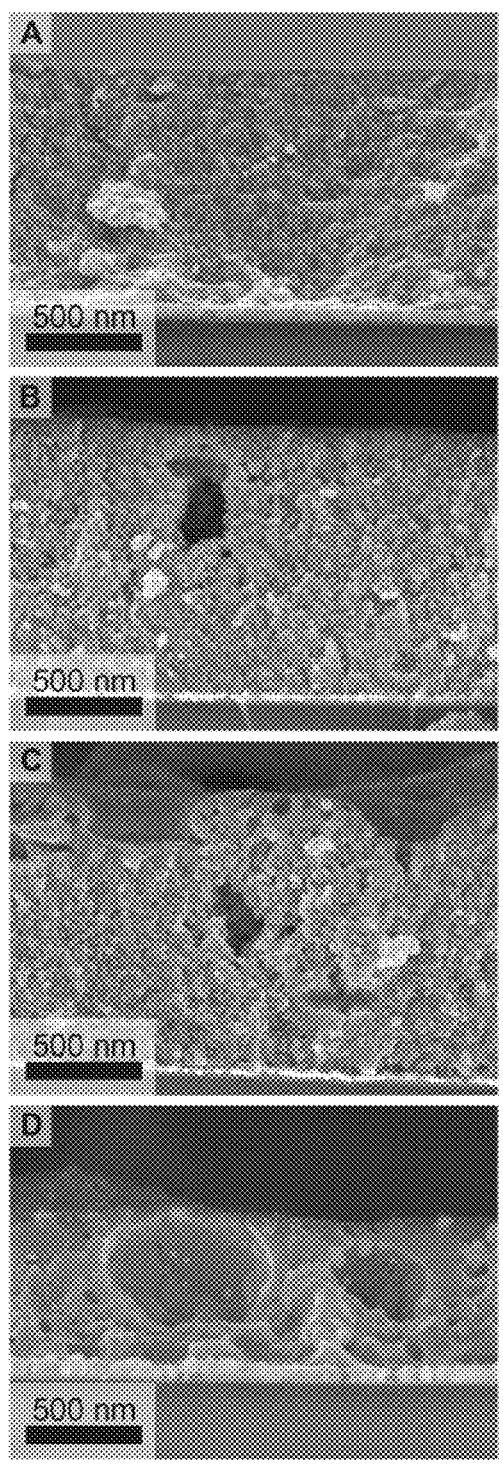
FIG. 4A-D

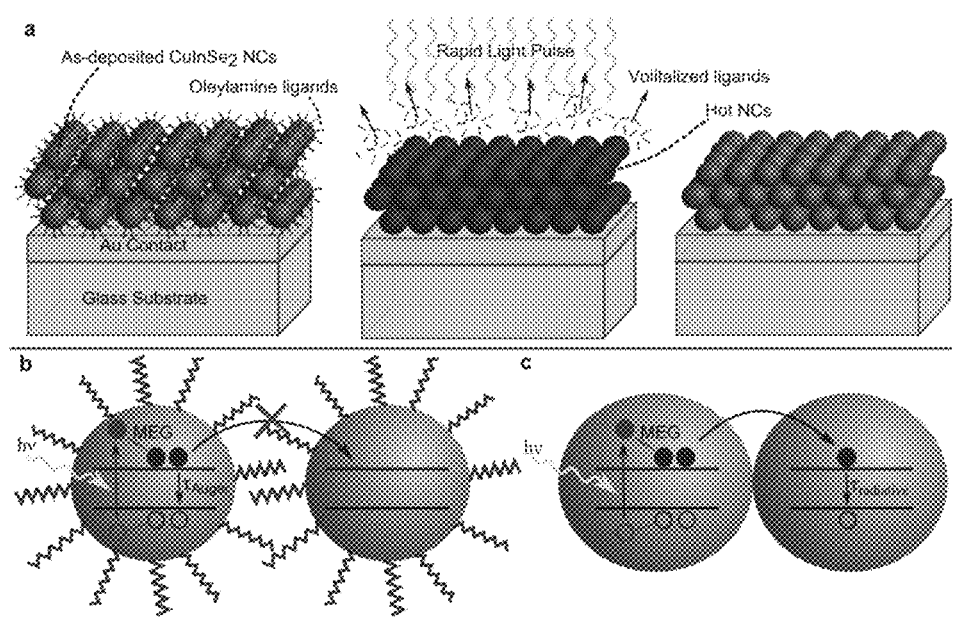
FIG. 5A-C

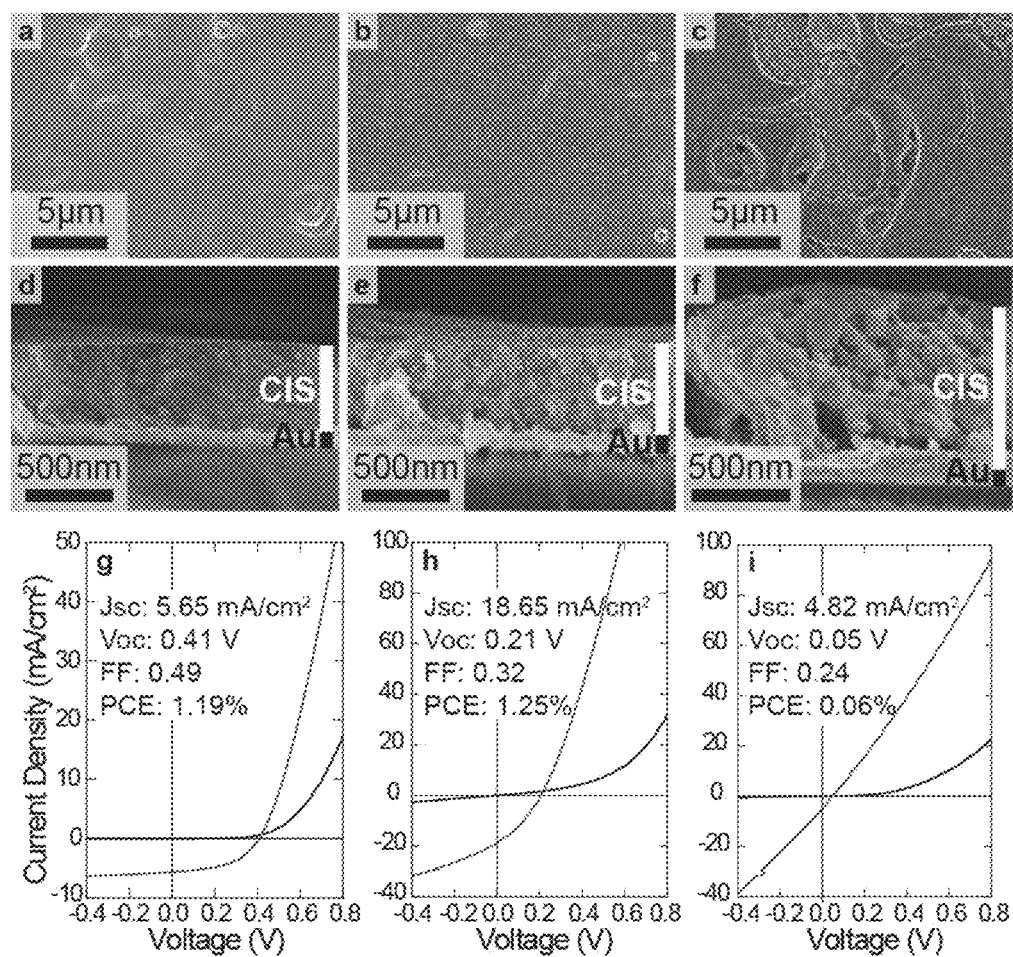
FIG. 6A-I

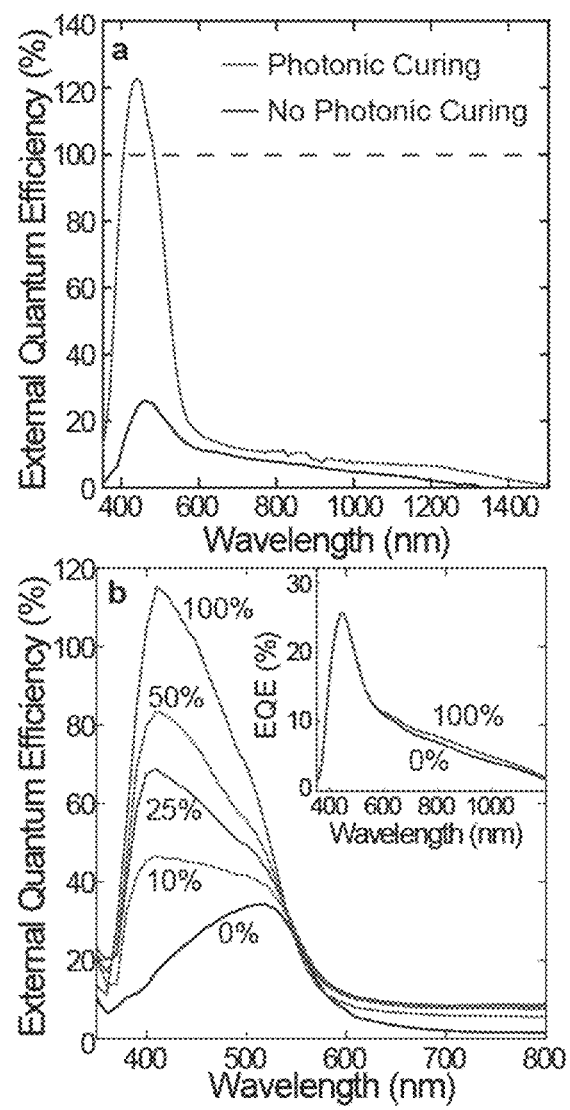
FIG. 7A-B

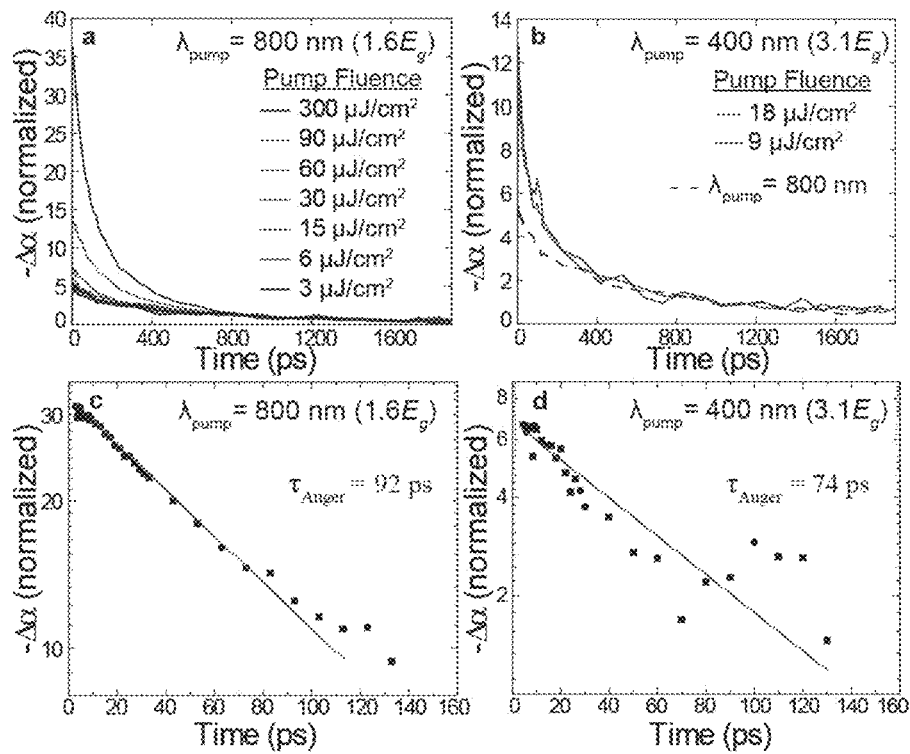
FIG. 8A-D
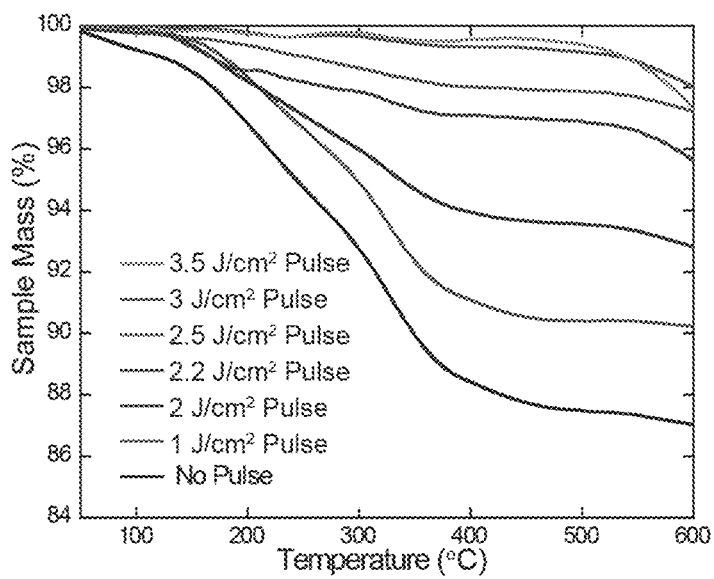
FIG. 9

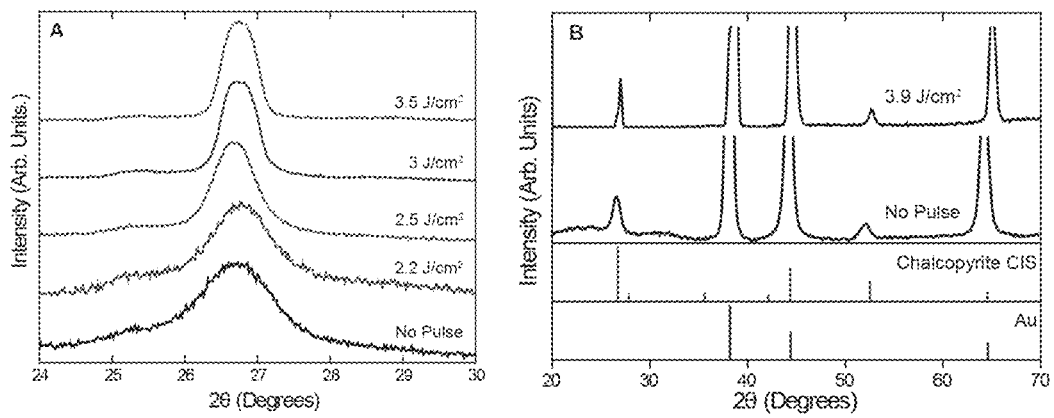
FIG. 12A-B
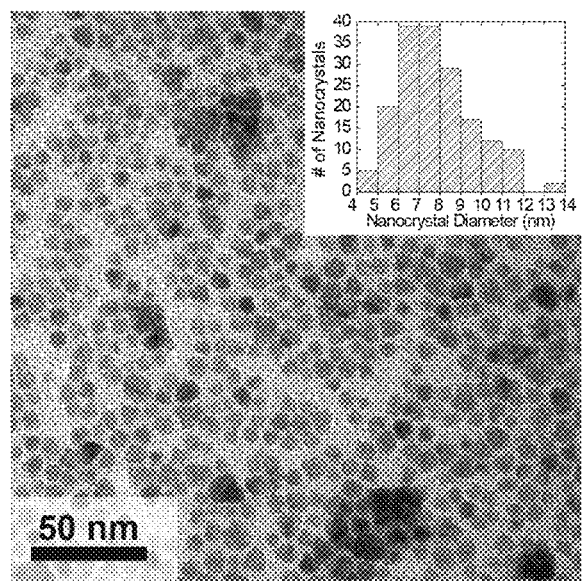
FIG. 13

PHOTONIC CURING OF NANOCRYSTAL FILMS FOR PHOTOVOLTAICS

CROSS-REFERENCE TO RELATED APPLICATIONS

This application is a continuation of U.S. patent application Ser. No. 15/509,075, filed on Mar. 6, 2017, which is the U.S. National Stage of PCT Application No. PCT/US2015/049858, filed on Sep. 12, 2015, which claims the benefit of and priority to U.S. Provisional Application No. 62/049,891, filed on Sep. 12, 2014, the disclosures of which are hereby incorporated by reference in their entirety for all purposes.

ACKNOWLEDGEMENT OF GOVERNMENT SUPPORT

This invention was made with Government support under Grant no. IIP-1134849, Grant no. 1357419, and Grant no. DGE1110007, awarded by the National Science Foundation. The Government has certain rights in this invention.

FIELD

The disclosed subject matter relates generally to photonic curing of nanocrystals, and to methods and devices using the photonic cured nanocrystals.

BACKGROUND

Colloidal semiconductor nanocrystals are of interest in low-cost, high efficiency photovoltaic (PV) devices (Stolle et al., "Nanocrystal photovoltaics: a review of recent progress," *Curr. Opin. Chem. Eng.* 2.2(2013):160-167). Nanocrystals can be synthesized in large quantities, dispersed in solvents, and deposited under ambient conditions on virtually any type of substrate. The highest efficiency reported for a nanocrystal PV without high-temperature processing is 7% for PbS nanocrystals (Ip et al., "Hybrid passivated colloidal quantum dot solids," *Nat. Nanotechnol.*, 7(9):577-582, 2012). High temperature sintering has been used to achieve higher efficiencies, of up to 12% for nanocrystals of CdTe (Panthani et al., "High Efficiency Solution Processed Sintered CdTe Nanocrystal Solar Cells: The Role of Interfaces," *Nano Lett.*, December 2013), $Cu(In,Ga)Se_2$ (CIGS) (Harvey et al., "Copper Indium Gallium Selenide (CIGS) Photovoltaic Devices Made Using Multistep Selenization of Nanocrystal Films," *ACS Appl. Mater. Interfaces*, 5(18):9134-9140, 2013), $Cu(In,Ga)S_2$ (Guo et al., "Ink formulation and low-temperature incorporation of sodium to yield 12% efficient $Cu(In,Ga)(S,Se)_2$ solar cells from sulfide nanocrystal inks," *Prog. Photovolt. Res. Appl.*, 21(1):64-71, 2013), and $Cu_2ZnSnS_4$ (Guo et al., "Fabrication of 7.2% Efficient CZTSSe Solar Cells Using CZTS Nanocrystals," *J. Am. Chem. Soc.*, 132(49):17384-17386, 2010). High-temperature processing, however, adds significant manufacturing cost—especially for $CuInSe_2$ and CIGS nanocrystals, which require heating under a selenium-rich atmosphere to induce sintering (selenization). To eliminate the need for high temperature selenization and still achieve reasonably high device efficiency from ink-processed $CuInSe_2$ and CIGS nanocrystal devices, as well as to allow coating a variety of substrates not currently accessible, improved methods are needed. The systems, compositions, methods, and devices disclosed herein address these and other needs.

SUMMARY

Disclosed herein, in one aspect, compositions and methods of making and using such compositions. In a further aspect, disclosed herein are methods of making a semiconductor layer from nanocrystals. In the disclosed methods a film of nanocrystals capped with a ligand can be deposited onto a substrate; and the nanocrystals can be irradiated with one or more pulses of light. Various coated and uncoated substrates can be used, as disclosed herein. The pulsed light can be used to substantially remove the ligands from the nanocrystals and leave the nanocrystals unsintered or sintered, thereby providing a semiconductor layer. Layered structures comprising these semiconductor layers with an electrode are also disclosed. Devices comprising such layered structures are also disclosed.

In a further aspect, disclosed are methods of making a layer from nanocrystals that comprises depositing a film of nanocrystals with various surface agents onto a substrate; and then irradiating the nanocrystals with one or more pulses of light. Examples of surface agents discussed herein are ions and dispersants. Various coated and uncoated substrates can be used, as disclosed herein. The pulsed light can be used to substantially remove the surface agents from the naocrystals and leave the nanocrystals unsintered or sintered, thereby providing a semiconductor layer. Layered structures comprising these semiconductor layers with an electrode are also disclosed. Devices comprising such layered structures are also disclosed.

Additional advantages of the disclosed systems, compositions, methods, and devices will be set forth in part in the description which follows, and in part will be obvious from the description, or can be learned by practice of the disclosed process. The advantages of the disclosed systems, compositions, methods, and devices will be realized and attained by means of the elements and combinations particularly pointed out in the appended claims. It is to be understood that both the foregoing general description and the following detailed description are exemplary and explanatory only and are not restrictive of the disclosed process, as claimed.

BRIEF DESCRIPTION OF THE FIGURES

The accompanying figures, which are incorporated in and constitute a part of this specification, illustrate several embodiments of the disclosure and together with the description, serve to explain the principles of the disclosure.

FIGS. 1A-1G show SEM images of a 1 μm thick oleylamine-capped $CuInSe_2$ nanocrystal film (FIG. 1A) before photonic curing and after photonic curing pulses of (FIG. 1B) 1.6 $J/cm^2$, (FIG. 1C) 2.1 $J/cm^2$, (FIG. 1D) 2.6 $J/cm^2$, (FIG. 1E) 3.1 $J/cm^2$, and (FIG. 1F) 3.5 $J/cm^2$. FIG. 1G shows SimPulse modeling of the nanocrystal film temperature during photonic curing pulses of 1.6, 2.1, 2.6, 3.1, and 3.5 $J/cm^2$, each 300 μs is in duration (in the graph the lines are ordered from bottom to top, 1.6, 2.1, 2.6, 3.1, and 3.5 $J/cm^2$). For the model a layered structure was used with a 1 μm thick $CuInSe_2$ film on a 60 nm thick Au metal film deposited on a 1.1 mm thick soda-lime glass substrate.

FIGS. 2A-2G show SEM images of a 1 μm thick ChaM-capped $CuInSe_2$ nanocrystal film (FIG. 2A) before photonic curing and after photonic curing pulses of (FIG. 2B) 1.0 $J/cm^2$, (FIG. 2C) 1.4 $J/cm^2$, (FIG. 2D) 1.8 $J/cm^2$, (FIG. 2E) 2.3 $J/cm^2$, and (FIG. 2F) 2.8 $J/cm^2$. Higher magnification is shown for each image in the insets, with the scale bars 500 nm long. FIG. 2G shows SimPulse modeling of the nanocrystal film temperature during photonic curing pulses of 1.0, 1.4, 1.8, 2.3, and 2.8 $J/cm^2$, each 300 μs in duration (in the graph the lines are ordered from bottom to top, 1.0, 1.4, 1.8, 2.3, and 2.8 $J/cm^2$). For the model a layered structure was used with a 1 μm thick CuInSe$_2$ film on a 60 nm thick Au metal film deposited on a 1.1 mm thick soda-lime glass substrate.

FIG. 3A shows XRD of both oleylamine-capped and ChaM-capped nanocrystals with and without photonic curing. The diffraction peaks for chalcopyrite CuInSe$_2$ (PDF #01-073-6321) and Au (PDF #01-075-6560) are shown for reference. FIG. 3B shows XRD highlighting the (112) diffraction peak of CuInSe$_2$ for oleylamine-capped nanocrystals before photonic curing, and after photonic curing pulses of 1.6 J/cm$^2$, 2.1 J/cm$^2$, 2.6 J/cm$^2$, 3.1 J/cm$^2$, and 3.5 J/cm$^2$ (this order is reflected in the lines in the graph from top to bottom). FIG. 3C shows XRD highlighting the (112) diffraction peak of CuInSe$_2$ for ChaM-capped nanocrystals before photonic curing (black) and after photonic curing pulses of 1.0 J/cm$^2$, 1.4 J/cm$^2$, 1.8 J/cm$^2$, 2.3 J/cm$^2$, and 2.8 J/cm$^2$ (this order is reflected in the lines in the graph from top to bottom).

FIGS. 4A-4D show cross-sectional SEM of ChaM-capped nanocrystals (FIG. 4A) before photonic curing and after photonic curing pulses of (FIG. 4B) 1.8 J/cm$^2$, (FIG. 4C) 2.3 J/cm$^2$, and (FIG. 4D) 2.8 J/cm$^2$.

FIGS. 5A-5C show images of photonic curing of nanocrystal films on Au-coated glass substrates. FIG. 5A shows photonic curing can be used to remove oleylamine capping ligands from the CuInSe$_2$ nanocrystal film without inducing grain growth. FIG. 5B shows when the capping ligands are present, they inhibit the collection of multiexcitons from the film, leading to electron-hole recombination by Auger recombination. FIG. 5C shows without the ligand barrier between nanocrystals, multiexciton transport becomes much more probable.

FIGS. 6A-6I show CuInSe$_2$ nanocrystal layers before and after photonic curing and their PV device performance. Top-down and cross-section SEM images of oleylamine-capped CuInSe$_2$ (CIS) nanocrystal film on Au-coated glass (FIG. 6A, FIG. 6D) before and after photonic curing with (FIG. 6B, FIG. 6E) 2.2 J/cm$^2$ and (FIG. 6C, FIG. 6F) and 3 J/cm$^2$ pulse fluence. (FIG. 6G-I) Corresponding current-voltage measurements (black curve is dark current; grey curve is measured under AM1.5 G illumination (100 mW/cm$^2$) of devices made with the nanocrystal films are provided below the SEM images.

FIGS. 7A-7B show external quantum efficiency (EQE) enhancements resulting from photonic curing of the CuInSe$_2$ nanocrystal layer used in PV devices. FIG. 7A shows EQE measurements taken under white light bias for CuInSe$_2$ nanocrystal devices without photonic curing (black curve) compared to the device made with cured (2.2 J/cm$^2$ pulse fluence) nanocrystals (grey curve). The short circuit currents determined from these data, of 4.95 mA/cm$^2$ and 14.29 mA/cm$^2$, are consistent with the short circuit currents measured under AM1.5 illumination (100 mW/cm$^2$). FIG. 7B shows EQE measured under varying white light bias intensity (100%, 50%, 25%, 10%, and 0% of the 50 mW/cm$^2$ bias light) with the same intensity of monochromated probe light. There is no change in EQE for the device made with as-deposited nanocrystals (inset), but the EQE decreases significantly for the cured device when the white light bias intensity was reduced to the amounts indicated.

FIGS. 8A-8D show Transient absorption (TA) spectroscopy of CuInSe$_2$ nanocrystal films after photonic curing. FIG. 8A shows TA kinetics normalized to $-\Delta\alpha=1$ at 1000 ps with an 800 nm pump wavelength and pump fluences of 300 μJ/cm$^2$, 90 μJ/cm$^2$, 60 μJ/cm$^2$, 30 μJ/cm$^2$, 15 μJ/cm$^2$, 6 μJ/cm$^2$, and 3 μJ/cm$^2$ (this order is reflected in the lines in the graph from top to bottom). FIG. 8B shows TA kinetics normalized to $-\Delta\alpha=1$ at 1000 ps with a 400 nm pump wavelength and pump fluences of 18 μJ/cm$^2$ (light grey) and 9 μJ/cm$^2$ (dark grey). The average low fluence background (average of 3, 6, 15 and 30 μJ/cm$^2$ signals) at 800 nm pump wavelength is also shown for comparison (dashed line). FIG. 8C shows TA kinetics showing the Auger recombination rate. The single exciton TA kinetics background (average 800 nm wavelength low fluence pump) is subtracted from the high fluence TA kinetics at 800 nm, 300 μJ/cm$^2$ pump, which shows the creation of multiexcitons due to the absorption of multiple photons per nanocrystal. The kinetics are plotted on a log scale and can be fitted to a single exponential with a time constant of 92 ps. FIG. 8D shows TA kinetics showing Auger recombination at 400 nm pump and low fluence. The single exciton TA kinetics background (average 800 nm wavelength low fluence pump) is subtracted from the TA kinetics at 400 nm, 9 μJ/cm$^2$ pump, which should only show Auger recombination if MEG is present. The kinetics are plotted on a log scale and can be fitted to a single exponential with a time constant of 74 ps.

FIG. 9 shows the thermogravimetric analysis (TGA) of CuInSe$_2$ nanocrystals processed by photonic curing using various pulse conditions. In the graph the lines are ordered from bottom to top, 1.0, 2, 2.2, 2.5, 3, and 3.5 J/cm$^2$.

FIGS. 12A-12B show the X-ray diffraction (XRD) data highlighting the (112) diffraction peak of chalcopyrite CuInSe$_2$. The curves have been offset for clarity with diffraction intensity normalized to the (112) pack maxima. The crystal sizes for each pulse condition were calculated using Scherrer analysis. Prior to photonic curing, the nanocrystals are 8.3 nm in diameter, which matches well with the size measured in TEM. After curing at 2.2 J/cm$^2$ and 2.5 J/cm$^2$, the nanocrystal size is 9.2 and 23.1 nm respectively. After curing at 3 J/cm$^2$ and 3.5 J/cm$^2$, the nanocrystals have sintered and the size is too large to calculate using Scherrer analysis. FIG. 12B contains XRD data showing a nanocrystal film before and after curing at 3.9 J/cm$^2$. The reference lines are for chalcopyrite CuInSe$_2$ (PDF #01-073-6321) and for Au (the back contact material) (PDF #01-075-6560).

FIG. 13 shows the TEM image of CuInSe$_2$ nanocrystals with average particle diameter of 8.1±2.1 nm based on the histogram shown in the inset generated from the TEM image.

FIG. 22A shows an SEM image of as-deposited nanocrystals on the Mo substrate. FIG. 22F shows an SEM image of the nanocrystal layer after annealing under Ar for 1 hr at 475° C., FIGS. 22B-2C and FIGS. 22G-22H show SEM images of the nanocrystal films after photonic curing. In the top-view image in FIG. 22C, the spherical structures are composed of sintered CuInSe₂ nanocrystals. XRD is shown for CuInSe₂ nanocrystals on Mo-coated soda-lime glass (solid lines) and bare soda-lime glass (dashed) before and after photonic curing (FIG. 22D). Reference patterns are for tetragonal CuInSe₂ (PDF #97-006-8928) and Mo (PDF #97-064-3959). XRD data for CuInSe₂ films annealed under Ar for 1 hr at 475° C. and then cured on Mo-coated soda-lime glass (solid lines) or on bare soda-lime glass (dashed) (FIG. 22E). A wurtzite CuInSe₂ reference pattern is shown that was calculated with CaRIne Crystallography 3.1 software using space group P63mc and lattice parameters a=4.08 Å and c=6.69 Å. SEM images are shown for cross-sectioned CuInSe₂ nanocrystal films after 1 hr anneal in Ar at 475° C. (FIG. 22F) before and (FIG. 22G) after photonic curing. The top-down SEM image of the film annealed under Ar prior to curing had significantly less de-wetting and agglomeration of the CuInSe₂ film (FIG. 22H).

FIG. 23C shows Spatial SEM of film after 3 J/cm², 300 μs treatment showing some agglomeration of sintered CIS layer as well as areas of local sintering seen in more detail in (FIG. 23D) cross sectional SEM image. FIG. 23E shows SEM of film after 3.5 J/cm², 300 μs pulse showing increased sintering leading to large grain CIS seen in (FIG. 23F) cross sectional SEM image. FIG. 23G shows XRD data of as-deposited nanocrystal film and nanocrystal films treated with 3 and 3.5 J/cm² pulses on MoSe₂/Mo bilayer back contacts. Indexed XRD data shown for Chalcopyrite CuInSe₂, Mo, and MoSe₂ (pdf #97-004-9800). As is typical of MoSe₂ synthesized via selenization of Mo, the (103) peak intensity is significantly reduced (Zhu et al. Determining Factor of MoSe₂ Formation in Cu(In,Ga)Se₂ Solar Cells. *Solar Energy Materials and Solar Cells* 101: 57-61, 2012; Abou-Ras et al. Formation and Characterisation of MoSe2 for Cu(In,Ga)Se₂ Based Solar Cells. *Thin Solid Films:* 480-481: 433-438, 2005.)

Figure 10:
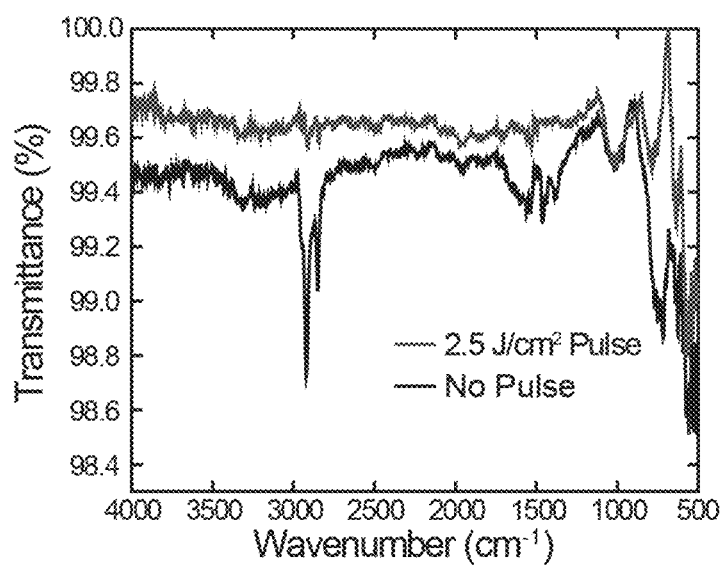
FIG. 10 shows the FTIR analysis of CuInSe$_2$ nanocrystals without photonic curing (black) and treated with a 2.5 J/cm$^2$ pulse (grey).

Photonic curing does not cause a significant shift in the location of the primary A1 mode, but does lead to a reduction in the relative intensity of the disorder band.

DETAILED DESCRIPTION

The compositions, methods, and devices described herein may be understood more readily by reference to the following detailed description of specific aspects of the disclosed subject matter and the Examples and Figures included therein.

Before the present compositions, methods, and devices are disclosed and described, it is to be understood that this disclosure is not limited to specific synthetic methods or to particular reagents, as such may, of course, vary. It is also to be understood that the terminology used herein is for the purpose of describing particular embodiments only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon. In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the film" includes mixtures of two or more such films, and the like.

"Optional" or "optionally" means that the subsequently described event or circumstance can or cannot occur, and that the description includes instances where the event or circumstance occurs and instances where it does not.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that when a value is disclosed, then "less than or equal to" the value, "greater than or equal to the value," and possible ranges between values are also disclosed, as appropriately understood by the skilled artisan. For example, if the value "10" is disclosed, then "less than or equal to 10" as well as "greater than or equal to 10" is also disclosed. It is also understood that throughout the application data are provided in a number of different formats and that this data represent endpoints and starting points and ranges for any combination of the data points. For example, if a particular data point "10" and a particular data point "15" are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific embodiment or combination of embodiments of the methods of the invention.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

It is understood that throughout this specification the identifiers "first" and "second" are used solely to aid in distinguishing the various components and steps of the disclosed subject matter. The identifiers "first" and "second" are not intended to imply any particular order, amount, preference, or importance to the components or steps modified by these terms.

Chemical Definitions

The term "aliphatic" as used herein refers to a non-aromatic hydrocarbon group and includes branched and unbranched, alkyl, alkenyl, or alkynyl groups.

The term "alkyl" as used herein is a branched or unbranched saturated hydrocarbon group of 1 to 24 carbon atoms, such as methyl, ethyl, n-propyl, isopropyl, n-butyl, isobutyl, t-butyl, pentyl, hexyl, heptyl, octyl, nonyl, decyl, dodecyl, tetradecyl, hexadecyl, eicosyl, tetracosyl, and the like. The alkyl group can also be substituted or unsubstituted. The alkyl group can be substituted with one or more groups including, but not limited to, alkyl, halogenated alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol, as described below.

The term "alkenyl" as used herein is a hydrocarbon group of from 2 to 24 carbon atoms with a structural formula containing at least one carbon-carbon double bond. Asymmetric structures such as $(Z^1Z^2)C=C(Z^3Z^4)$ are intended to include both the E and Z isomers. This can be presumed in structural formulae herein wherein an asymmetric alkene is present, or it can be explicitly indicated by the bond symbol C=C. The alkenyl group can be substituted with one or more groups including, but not limited to, alkyl, halogenated alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol, as described below.

The term "alkynyl" as used herein is a hydrocarbon group of 2 to 24 carbon atoms with a structural formula containing at least one carbon-carbon triple bond. The alkynyl group can be substituted with one or more groups including, but not limited to, alkyl, halogenated alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol, as described below.

The term "aryl" as used herein is a group that contains any carbon-based aromatic group including, but not limited to, benzene, naphthalene, phenyl, biphenyl, phenoxybenzene, and the like. The term "heteroaryl" is defined as a group that contains an aromatic group that has at least one heteroatom incorporated within the ring of the aromatic group. Examples of heteroatoms include, but are not limited to, nitrogen, oxygen, sulfur, and phosphorus. The term "non-heteroaryl," which is included in the term "aryl," defines a group that contains an aromatic group that does not contain a heteroatom. The aryl or heteroaryl group can be substituted or unsubstituted. The aryl or heteroaryl group can be substituted with one or more groups including, but not limited to, alkyl, halogenated alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol as described herein. The term "biaryl" is a specific type of aryl group and is included in the definition of aryl. Biaryl refers to two aryl groups that are bound together via a fused ring structure, as in naphthalene, or are attached via one or more carbon-carbon bonds, as in biphenyl.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, etc. The term "heterocycloalkyl" is a cycloalkyl group as defined above where at least one of the carbon atoms of the ring is substituted with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol as described herein.

The term "cycloalkenyl" as used herein is a non-aromatic carbon-based ring composed of at least three carbon atoms and containing at least one double bound, i.e., C=C. Examples of cycloalkenyl groups include, but are not limited to, cyclopropenyl, cyclobutenyl, cyclopentenyl, cyclopentadienyl, cyclohexenyl, cyclohexadienyl, and the like. The term "heterocycloalkenyl" is a type of cycloalkenyl group as defined above, and is included within the meaning of the term "cycloalkenyl," where at least one of the carbon atoms of the ring is substituted with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, alkoxy, alkenyl, alkynyl, aryl, heteroaryl, aldehyde, amino, carboxylic acid, ester, ether, halide, hydroxy, ketone, nitro, silyl, sulfo-oxo, sulfonyl, sulfone, sulfoxide, or thiol as described herein.

The term "cyclic group" is used herein to refer to either aryl groups, non-aryl groups (i.e., cycloalkyl, heterocycloalkyl, cycloalkenyl, and heterocycloalkenyl groups), or both. Cyclic groups have one or more ring systems that can be substituted or unsubstituted. A cyclic group can contain one or more aryl groups, one or more non-aryl groups, or one or more aryl groups and one or more non-aryl groups.

The terms "amine" or "amino" as used herein are represented by the formula $NA^1A^2A^3$, where $A^1$, $A^2$, and $A^3$ can be, independently, hydrogen, an alkyl, halogenated alkyl, alkenyl, alkynyl, aryl, heteroaryl, cycloalkyl, cycloalkenyl, heterocycloalkyl, or heterocycloalkenyl group described above.

The term "complex" describes a coordination complex, which is a structure comprised of a central atom or molecule that is weakly connected to one or more surrounding atoms or molecules, or describes chelate complex, which is a coordination complex with more than one bond.

As used herein, the term "composition" is intended to encompass a product comprising the specified ingredients in the specified amounts, as well as any product which results, directly or indirectly, from combination of the specified ingredients in the specified amounts.

Certain materials, compounds, compositions, and components disclosed herein can be obtained commercially or readily synthesized using techniques generally known to those of skill in the art. For example, the starting materials and reagents used in preparing the disclosed compounds and compositions are either available from commercial suppliers such as Aldrich Chemical Co., (Milwaukee, Wis.), Acros Organics (Morris Plains, N.J.), Fisher Scientific (Pittsburgh, Pa.), Sigma (St. Louis, Mo.), Pfizer (New York, N.Y.), GlaxoSmithKline (Raleigh, N.C.), Merck (Whitehouse Station, N.J.), Johnson & Johnson (New Brunswick, N.J.), Aventis (Bridgewater, N.J.), AstraZeneca (Wilmington, Del.), Novartis (Basel, Switzerland), Wyeth (Madison, N.J.), Bristol-Myers-Squibb (New York, N.Y.), Roche (Basel, Switzerland), Lilly (Indianapolis, Ind.), Abbott (Abbott Park, Ill.), Schering Plough (Kenilworth, N.J.), Akzo Nobel Chemicals Inc (Chicago, Ill.), Degussa Corporation (Parsippany, N.J.), Monsanto Chemical Company (St. Louis, Mo.), Dow Agrosciences LLC (Indianapolis, Ind.), DuPont (Wilmington, Del.), BASF Corporation (Florham Park, N.J.), Syngenta US (Wilmington, Del.), FMC Corporation (Philadelphia, Pa.), Valent U.S.A. Corporation (Walnut Creek, Calif.), Applied Biochemists Inc (Germantown, Wis.), Rohm and Haas Company (Philadelphia, Pa.), Bayer CropScience (Research Triangle Park, N.C.), or Boehringer Ingelheim (Ingelheim, Germany), or are prepared by methods known to those skilled in the art following procedures set forth in references such as Fieser and Fieser's Reagents for Organic Synthesis, Volumes 1-17 (John Wiley and Sons, 1991); Rodd's Chemistry of Carbon Compounds, Volumes 1-5 and Supplementals (Elsevier Science Publishers, 1989);

Organic Reactions, Volumes 1-40 (John Wiley and Sons, 1991); March's Advanced Organic Chemistry, (John Wiley and Sons, 4th Edition); and Larock's Comprehensive Organic Transformations (VCH Publishers Inc., 1989). Other materials can be obtained from commercial sources.

Various chemical abbreviation known in the art are recited herein with respect to components, precursors, and other compounds. For example, the abbreviation "(acac)" is used to refer to acetyl acetonate. One of skill in the art could readily understand any chemical abbreviations utilized with respect to such components, precursors, and other compounds.

As used herein, the term "ink" is intended to refer to a dispersion of nanocrystals within a liquid, such as, for example, a solvent or vehicle system, unless specifically stated to the contrary.

Reference will now be made in detail to specific aspects of the disclosed materials, compounds, compositions, articles, and methods, examples of which are illustrated in the accompanying Examples and Figures.

Systems

Systems comprising a nanocrystal (also referred to herein as quantum dots, semiconductors, and/or NC) are disclosed herein. "Nanocrystal" refers to a semiconductor crystal with a nanoscale diameter, and because of its small size behaves like a potential well that confines electrons in three dimensions to a region on the order of the electrons' de Broglie wavelength in size, a few nanometers in a semiconductor. The nanocrystal can absorb energy of a first electromagnetic region and emit radiation in a second electromagnetic region; the particular absorbance or emission regions can depend upon the material and diameter of the nanocrystal.

Nanocrystals

In one aspect, a nanocrystal can comprise an inorganic material, such as, for example, Cu. Other components, such as other inorganic elements and/or organic ligands and/or dopants can, in various aspects, optionally be present. Materials that can be incorporated into nanocrystals include, without limitation, indium, gallium, zinc, and selenide, sodium, and sulfide. Exemplary nanocrystals can correspond to the formulas CdTe, $CuInSe_2$, $CuInS_2$, $CuInxGa_{1-x}Se_2$, $CnInTe_2$, $CuGaxIn_{1-x}Te_2$, $CuGa_xIn_{1-x}Te_2$, $Cu_2ZnSnS_2$, $Cu_2ZnSnS_4$, $Cu_2ZnSnSe_4$, or $Cu(In_xGa_{1-x})Se_2$, wherein x is a whole number or fraction that can be determined by compositional analysis and generally depends on the stoichiometry of the various starting materials. In certain examples x is from 0 to 10, e.g., from 0 to 5, or from 0 to 1. In one aspect, a nanocrystal can comprise silicon. In one aspect, a nanocrystal can comprise a binary composition, such as, for example, CdTe. In one aspect, a nanocrystal can comprise a ternary composition, such as, for example, $CuInSe_2$. In another aspect, a nanocrystal can comprise a quaternary composition, such as, for example, $Cu_2ZnSnS_4$.

In an aspect of the invention, the nanocrystal of the present invention can comprise the composition corresponding to a formula, $Cu(In_xGa_{1-x})Se_2$, where x can be from 0 to 10, 0 to 5, or 0 to 1, which can additionally comprise various compositional ratios of the elements in the formula. It should be appreciated that the composition of such a nanocrystal can be tuned by adjusting the relative amounts of each element, for example, In and Ga, during synthesis. For example, x can be a whole integer selected from 0 and 1. Or, in the alternative, x can be a fraction (i.e. a number greater than 0 and less than 1). For example, x can be 0.2, 0.3, 0.4, 0.5, 0.6, 0.7, 0.8, or 0.9. Specific examples can include nanocrystals corresponding to the formula, $Cu(In_xGa_{1-x})Se_2$, wherein x is 0, 0.75, 0.50, and 1 as determined by, for example, XRD, with corresponding values of 0, 0.79, 0.51, and 1 as determined by, for example, EDS. The amount of Ga (1−x) can be determined from x. For example, if x is 0.75, then 1−x is 0.25. It should be appreciated that the various methods of the present invention provide the ability to adjust the stoichiometry of any combination of elements within a mixture and thus, provide a wide range of nanocrystal compositions.

The nanocrystals of the present invention can be prepared by a variety of methods. It should be understood that the specific order of steps and/or contacting components in the recited methods can vary, and the present invention is not intended to be limited to any particular order, sequence, or combination of individual components or steps. One of skill in the art, in possession of this disclosure, could readily determine an appropriate order or combination of steps and/or components to produce a nanocrystal.

The system can exhibit unique optical properties that are a function of both the nanocrystal composition and physical size. Both the absorption and the photoluminescent wavelength are a function of the nanocrystal size and composition. The narrower the size distribution of the nanocrystals, the narrower the full-width half max (FWHM) of the resultant photoluminescent spectra. The average particle size of the nanocrystal can be from about 0.1 nm to about 100 nm, about 0.1 nm to about 50 nm, about 0.1 nm to about 25 nm, about 0.1 nm to about 20 nm, or about 1 nm to about 50 nm. For example, the average particle size of the nanocrystal can be about 10 nm or less, about 20 nm or less, about 30 nm or less, about 40 nm or less, about 50 nm or less, about 100 nm or less, about 200 nm or less, or about 250 nm or less. In some embodiments, the average particle size of the nanocrystal can be about 0.1 nm or greater, 0.5 nm or greater, 1 nm or greater, 1.5 nm or greater, 2 nm or greater, 2.5 nm or greater, 3 nm or greater, 3.5 nm or greater, 4 nm or greater, 4.5 nm or greater, 5 nm or greater, 6 nm or greater, or 10 nm or greater. The average particle size refers to the average particle size of the nanocrystal alone and/or in the systems provided herein. The nanocrystals can be spherical, approximately spherical, or nonspherical. In spherical cases, the diameter typically refers to the diameter of the nanocrystal. In nonspherical cases, the diameter typically refers to the diameter of a sphere having the same hydrodynamic volume of the nanocrystal.

Nanocrystal

In one aspect, a precursor of each of the desired elements to be present in the nanocrystal can be contacted together with an aliphatic amine to form a nanocrystal. In other aspects, any one or more of the precursors can be contacted together to form one or more mixtures. In such an aspect, any given mixture can comprise a solvent. In addition, any given mixture can optionally be degassed and/or sparged with an inert gas. Further, any given mixture or combination of mixtures can be heated.

An aliphatic amine can be any aliphatic amine suitable for use in the preparation of the nanocrystal. In one aspect, the aliphatic amine can be an alkyl amine. In another aspect, an aliphatic amine can be oleylamine. In another aspect, the specific number of carbons in an aliphatic amine can vary, and the present invention is not intended to be limited to any particular aliphatic amine, such as, for example, an oleylamine. Exemplary chain lengths can comprise, but are not limited to, 10, 11, 12, 13, 14, 15, 16, 17, 18, 19, 20, 21, 22, 23, 24, 25, 26, 27, 28, 29, or 30 carbons. In one aspect, an aliphatic amine has a high boiling point.

In one aspect, a nanocrystal can comprise a coating (surface agent) over all or a portion of its surface. A coating, if present, can be useful to, for example, assist in dispersion of the nanocrystal in an ink or solvent, assist in the formation of a film or layer comprising the nanocrystal, and/or to protect the composition and/or structure of a nanocrystal during the formation of a film or layer, and/or during use. A coating, if present, can comprise an organic material, an inorganic material, or a combination thereof. In one aspect, a coating comprises an organic material. In another aspect, a coating comprises an inorganic material. In a specific aspect, a coating comprises a metal. In yet another aspect, a nanocrystal does not comprise a coating. Two or more nanocrystals are not required to comprise the same composition and/or coating, and combinations wherein, for example, a portion of the nanocrystals comprise a coating, and wherein; for example, two coating materials are used, are considered to be part of the invention. A coating, if present, can comprise an electrically conductive material, such as, for example, a conjugated molecule, and/or an electrically insulating coating, such as, for example, an aliphatic (e.g., an alkyl, alkenyl, alkynyl, and/or phenyl containing) coating.

In one aspect, a coating, if present, can comprise a capping ligand. In various aspects, a capping ligand can comprise an oxygen containing compound, a nitrogen containing compound, a phosphorous containing compound, a sulfur containing compound, or a combination thereof. In yet other aspects, a capping ligand can comprise other compounds not specifically referenced. In one aspect, a capping ligand can comprise an aliphatic. In other aspects, a coating can comprise an alkyl chain, an aromatic compound, a heterocyclic compound, such as a heterocyclic amine, a phenyl moiety, and/or combinations thereof. In another aspect, a capping ligand can form a shell around at least a portion of any nanocrystal. In still another aspect, a capping ligand can form a shell around all or substantially all of the nanocrystals. In one aspect, a capping ligand can assist in the dispersion of nanocrystals in a solvent, such as, for example, to enable the formulation of inks or paints containing the nanocrystals. In another aspect, a nanocrystal can be coated with multiple layers, such as, for example, by a thin inorganic layer that is then surrounded by an organic capping ligand layer.

A coating material and/or capping ligand, can be selected so that all or a portion of the coating material and/or capping ligand can be removed during processing, film formation, after film formation, or during use. The specific method of removing a coating and/or capping ligand can vary depending upon the nature, composition, and binding of the coating material and/or capping ligand to the nanocrystal. Exemplary methods for removing a coating material and/or capping ligand can include thermal, chemical, optical methods, other methods and/or combinations thereof. Specific examples include thermal desorption, solvent washing, exposure to ozone and/or UV radiation.

In other examples, the coating material can be an ion or dispersant.

Films Comprising Nanocrystals

Nanocrystal disclosed herein can be incorporated into a film (e.g., a thin film). Films can be coated onto any appropriate substrate at any temperature (e.g., room temperature). Example substrates include, without limitation, glass, metal-coated glass, polymer material, metal-coated polymers, metal, metal alloy, quartz, paper, transparent conducting material, nanowires, and nanotubes. Examples of polymer material are polyalkylenes, polyesters, polyamides, polycarbonates, and polyalkoxyls. In specific examples, the substrate can be Mo-coated glass, Au-coated glass, Ni-coated glass, indium tin oxide-coated glass, Mo-coated polyethylene terephthalate, Au-coated polyethylene terephthalate, Ni-coated polyethylene terephthalate, indium tin oxide-coated polyethylene terephthalate, non-woven indium tin oxide, or any other suitable material. In one aspect, a substrate can be electrically conductive, for example, to carry charge to or from a film or layer of nanocrystals. In specific examples, the substrate can be a metal or metal coated substrate. Films can be produced through a variety of methods; including spin coating, dip coating, drop casting, painted, spray coating, deposited, and solution or printing processing (e.g. gravure, flexographic printing, ink-jet printing). In a specific aspect, nanocrystals can be dip coated onto a substrate. In another specific aspect, nanocrystals can be printed, such as, for example, with an ink jet printer. In one aspect, one or more nanocrystals can be coated onto and/or at least partially embedded into a polymeric material. In another aspect, one or more nanocrystals can be used to make a hybrid layer of nanocrystal(s) in an organic material or organic matrix.

Various solvents can be used to coat a nanocrystal dispersion onto a substrate including, without limitation, toluene, chloroform, tetrachloroethylene, decane, methyl isopropyl ketone, dicholorobenzene, butyl ether, and octane, among others. In one aspect, a plurality of nanocrystals can be assembled or allowed to assemble in an at least partially ordered array. In another aspect, a plurality of nanocrystals can form a self assembled ordered array. Such an at least partially ordered array can comprise a monolayer, a multi-layer material, and can vary in thickness depending upon the number of layers, specific nanocrystals, and/or optional matrix material.

By changing the nanocrystal concentration in a solution, film thickness, for example, can be varied and/or tuned. In one aspect, a substantially linear relationship between the concentration of the nanocrystal solution used for spray-coating and the resulting film thickness can be observed. Thus, specific film thicknesses can, for example, be targeted by controlling the concentration of the solution from which the films are cast. Additionally spray-coating can be conducted at different pressures for the solvent/nanocrystal solution. In aspects of this invention, for example, the spray-coating was conducted at a pressure of 50 lbs/in$^2$ (psig) on a commercial spray gun (Iwata Eclipse HP-CS) for a nanocrystal concentration of 20 mg/mL in toluene.

Spray-coating can be carried out from a low-volatility solvent to reduce or prevent small and large cracks in a film. In one aspect, a film can be continuous across at least a portion of a substrate. In another aspect, a film can be discontinuous and cover one or more discrete regions on at least a portion of a substrate. In other aspects, a film can be resistant to or substantially resistant to cracking, spalling, and/or flaking.

As-synthesized nanocrystals were dispersible in a variety of organic solvents. In one aspect, by spray-coating nanocrystals from high-boiling point organic solvents, highly uniform, substantially defect-free films can be formed. By changing, for example, the nanocrystal concentration, various thicknesses can be achieved. It should be noted that the specific handling and, for example, drying steps as described herein can vary and one of skill in the art could readily select an appropriate handling and/or drying technique for a given material and/or application. As such, the present disclosure is not limited to any particular handling and/or drying technique or procedure.

Alternatively, nanocrystals disclosed herein can be processed onto a substrate through inkjet printing. Substrates compatible with this method include, without limitation, paper, plastic, and indium tin oxide (ITO), other suitable substrates and/or combinations thereof. Any suitable printer can be used, such as, for example, a Fujifilm DIMATIX™ inkjet printer if an inkjet printing process is employed.

It should be appreciated that spray-coating nanocrystals disclosed herein from a certain solvents can result in cracking and non-uniform films. The particular solvent composition, spray-coating solution, and procedure, such as, for example, speed, can vary depending upon the particular components, solvents, and apparatuses, and one of skill in the art could readily select an appropriate solution, concentration, and/or speed, for example, for a given application.

The methods disclosed herein can produce films of varying thickness. In one aspect, a film thickness can range from about 1 to about 3500 nm. For example, if a lower concentration or nanocrystal solution (e.g. less than about 10 mg/mL) is used for film deposition, then films ranging from about 1 to about 1500 nm can be produced, such as, for example, films about 10, 20, 30, 40, 50, 60, 70, 80, 100, 200, 300, 400, 500, 600, 700, 800, 900, 1000, 1300, and 1500 nm thick. Alternatively, more concentrated (e.g. above about 10 mg/mL, up to for example, 30 mg/mL) nanocrystal dispersions can be used to deposit films with thicknesses ranging from about 1500 nm to about 3500 nm, for example, films with thicknesses of about 2000, 2500, 3000, and 3300 nm. In other aspects, a film thickness of less than about 1 nm or greater than about 3500 nm can be produced.

The nanocrystals on the substrate can then be irradiated with one or more pulses of light. The pulse can be under 1 second. For example, the pulse can be from about 100 to about 500 μs, from about 100 to about 350 μs, from about 150 to about 300 μs, or about 200 μs. In specific examples the pulse is about 100, 125, 150, 175, 200, 225, 250, 275, 300, 325, 350, 375, 400, 425, 450, 475, 500, 600, 700, 800, or 900 μs, where any of the stated values can form the upper or lower end point of a range. The pulse can also have an energy of from about 1.0 to about 8 J/cm$^2$, e.g., from about 1 to about 7, from about 1 to about 6, from about 1 to about 5, from about 1 to about 4, from about 1 to about 3, from about 1 to about 2, from about 3 to about 8, from about 4 to about 8 J/cm$^2$. In a specific example, the pulse has an energy of from about 1 to about 7.1 J/cm$^2$.

The nanocrystal film can be irradiated in its entirety by the one or more pulses of light. Or certain sections of the nanocrystal film can be irradiated with one or more pulses of light. Still further, different sections of the nanocrystal film can be irradiated with a different number and/or energies of light. With these methods a pattern can be created on the nanocrystal film.

The light source can be a flash lamp. The light source can be a broad band light source, e.g., a Xenon lamp. Heating the nanocrystals under a selenium atmosphere can be avoided when using the methods disclosed herein.

Films produced by the methods disclosed herein can be, for example, resistant films or conductive films. In another aspect, a film can be semi-conductive. In yet other aspects, a film can have a varying conductivity, for example, across points on the surface thereof. For example, the resistance of as-cast films can be about 1 kΩ·cm before any further treatment. This value is two to three orders of magnitude higher than the reported resistance desired to produce an efficient photovoltaic device. The nanocrystal layer can be sintered; though in certain examples the nanocrystal layer can be unsintered but substantially free (e.g., less than 5 or less than 1 wt. %) of ligands. It should be appreciated, however, that by removing organic ligands from a film and sintering nanocrystals together, an increase in, for example, conductivity can be obtained. To achieve this, a variety of film treatments can be carried out and the resulting properties of the nanocrystal films can be characterized.

UV-ozone and oxygen plasma are also common techniques used in the semiconductor industry to reactively remove organics. Treating the CIS nanocrystal films under oxygen plasma or UV-ozone can result in no formation of oxides or other phases by X-ray diffraction.

In a specific aspect, disclosed herein is a layer of CuInSe$_2$ nanocrystals having a Raman spectrum characterized by an A1 mode at about 180 cm$^{-1}$ and a band of modes from about 200 to about 275 cm$^{-1}$ that has less intensity than a band of modes from about 200 to about 275 cm$^{-1}$ from CuInSe$_2$ nanocrystals having oleyl amine ligands.

Devices Comprising Nanocrystals

Nanocrystals of the present invention can be incorporated into electronic and photonic devices, such as, for example, a photovoltaic device. An exemplary photovoltaic device is a solar cell. The absorber layer in a solar cell, for example, can comprise nanocrystals disclosed herein. Other devices that can incorporate the nanocrystals of the present invention include printable electronic applications, such as transistors and photodetectors. In one aspect, a device can be constructed, wherein one or more nanocrystals can be utilized as a precursor for making, for example, a film or layer. In an exemplary aspect, a plurality of nanocrystals can be deposited and then at least partially fused together to form a film, wherein the at least partially fused film is no longer made of individual nanocrystals. While such a film no longer contains any or any substantial number of individual nanocrystals, the properties of the produced film can be at least partially dependent on the properties of the nanocrystal precursors utilized to form the film. A film of fused or partially fused particles can, in various aspects, be formed by heating the nanocrystals to a temperature sufficient to at least partially fuse together. In various aspects, such a temperature can range from ambient up to about 100, 150, 200, 250, 300, 350, 400, 450, 500, 550, 600, 650° C., or higher. In one aspect, a plurality of nanocrystals can be heated to a temperature of up to about 250° C. In another aspect, a plurality of nanocrystals can be heated to a temperature of up to about 600° C.

A nanocrystal film disclosed herein, for example, can be used in a layered structure in a wherein the structure comprises a nanocrystal (semiconductor) layer as disclosed herein and a first electrode. Also, disclosed are layered structures that comprise two electrodes sandwiching the nanocrystal (semiconductor) layer. These structure layers can optionally be in partial contact with a second, different semiconducting layer. At least one of the first and second electrodes can comprise a transparent conductive layer. At least one of the first and second electrodes can comprise a reflective metal. The disclosed layered structures can also comprise a substrate, such as any of the substrates disclosed herein.

A nanocrystal film disclosed herein, for example, can be used as a layer in a photovoltaic device. Such a device could be flexible, for example, if a nanocrystal layer were coated onto a flexible substrate, such as, for example, plastic.

A stoichiometry controlled absorber layer can be created for use with a photovoltaic device by controlling nanocrystal stoichiometry (i.e. the relative amounts of the materials making up the nanocrystal). A photovoltaic device could comprise, for example, a nanocrystal layer with a composition gradient. A film with a GaxIn1−x concentration gradient, for example, could be created such that x varies from about 0 to about 1 through the film.

In various aspects, a layer can be electrically conductive or electrically insulating.

In other aspects, a layer can comprise nanocrystals, such as those described herein; comprising a ternary composition, a quaternary composition, or a combination thereof.

In one aspect, a layer can be absorbing, such as, for example, optically absorbing. Such a layer can be useful in, for example, absorbing visible light such as in a photovoltaic device. Such an absorbing layer can comprise any of the nanocrystals or a combination of nanocrystals, such as a plurality of non-spherical and/or substantially non-spherical nanocrystals and/or a self assembled array of nanocrystals described herein. In one aspect, a layer comprising nanocrystals has no or substantially no pores, pinholes, and/or defects. In another aspect, the number and size of pores, pinholes, and/or defects in a layer do not adversely affect the performance of the layer in a photovoltaic device.

In another aspect, the degree of light absorption of an absorbing layer can vary depending upon the size, range of sizes, and/or distribution of sizes of the nanocrystals comprising the layer. In yet another aspect, carrier multiplication can occur upon absorption of a photon by an absorbing layer.

In one aspect, an absorbing layer comprises a plurality of the nanocrystals described herein. In another aspect, a photovoltaic device can comprise an absorbing layer comprising a plurality of the nanocrystals described herein, and an anode and a cathode. In another aspect, a photovoltaic device can comprise an absorbing layer, a semiconducting buffer layer, and a cathode and an anode. In yet another aspect, a photovoltaic device can comprise an absorbing layer comprising any of the nanocrystals described herein and an organic semiconductor. In certain examples, the entire device or the layered structures and electrodes can be irradiated with one or more pulses of light. So it is not required that just the layered structures be irradiated and then the device is constructed. As such, disclosed herein are devices that comprise one or more nanocrystal layers on a substrate, and one or more electrodes, wherein the nanocrystal layers, substrate, and electrodes have been irradiated with one or more pulses of light.

Photovoltaic devices can also be created with absorbing layers comprising controlled crystallographic orientations created by depositing nanocrystals with various non-spherical shapes, such as disks, that can self-assemble with a preferred crystallographic orientation.

A photovoltaic device can comprise a number of components and configurations, and the present disclosure is not intended to be limited to any particular device components and/or configurations. In various aspects, a photovoltaic device can comprise one or more absorbing layers, buffer layers, and/or metal contact layers. In another aspect, a photovoltaic device comprises at least two functional layers. In one aspect; at least one functional layer of a photovoltaic device comprises nanocrystals as described herein that are printed, such as, for example, with an inkjet printer. In another aspect, at least two functional layers of a photovoltaic device comprise nanocrystals as described herein that are printed. In yet another aspect, each of the functional layers in a photovoltaic device comprise nanocrystals as described herein and are printed.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the invention and are not intended to limit the scope of what the inventors regard as their invention. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Copper (I) chloride (CuCl, 99.99%), elemental selenium (Se, 99.99%), cadmium oxide (CdO, 99.99%), elemental tellurium (Te, 99.997%), tributylphosphine (TBP, 97%), oleic acid (99%), and octadecene (90%) were obtained from Aldrich; indium (III) chloride ($InCl_3$, 99.99%) was obtained from Strem Chemical; oleylamine (>40%) was obtained from TCI America; toluene and ethanol were obtained from Fisher Scientific. Oleylamine (OLA) was degassed by pulling vacuum overnight at ~100 mTorr at 110° C. and stored in an $N_2$ filled glovebox before use. All other chemicals were used as received.

Example 1: Nanocrystal Synthesis $CuInSe_2$ nanocrystals are synthesized with either oleylamine capping ligands or chalcogenidometallate cluster (ChaM) ligands. Oleylamine can be used a capping ligand for $CuInSe_2$ to facilitate dispersibility in organic solvents and easy processing, but can also hinder charge transport in devices and limit efficiency (Akhavan et al., "Thickness-limited performance of $CuInSe_2$ nanocrystal photovoltaic devices," *Opt. Express*, 18(S3):A411-A420, 2010). ChaM ligands, also referred to as metal chalcogenide complexes (MCCs), can improve nanocrystal film electrical properties (Stolle et al., "Comparison of the Photovoltaic Response of Oleylamine and Inorganic Ligand-Capped $CuInSe_2$ Nanocrystals," *ACS Appl. Mater. Interfaces*, 4(5):2757-2761, 2012), and have been shown to be able to aid sintering of $CuInSe_2$ and CIGS nanocrystals (Jiang et al., "Soluble Precursors for $CuInSe_2$, $CuIn_{1-x}Ga_xSe_2$, and $Cu_2ZnSn(S,Se)_4$ Based on Colloidal Nanocrystals and Molecular Metal Chalcogenide Surface Ligands," *J. Am. Chem. Soc.*, 134(11):5010-5013, 2012).

Oleylamine-capped or ChaM-capped $CuInSe_2$ nanocrystals are deposited into films and then processed by photonic curing with a broadband xenon flash lamp. Nanocrystal films can reach over 1000° C. in less than a millisecond and then rapidly return to room temperature (Schroder A., "Mechanisms of photonic curing: processing high temperatures on low temperature substrates," *Nanotech Conf. Expo 2011 Interdiscip. Integr. Forum Nanotechnol. Biotechnol. Microtechnology*, 2: 220-223, 2011). Mild photonic curing of $CuInSe_2$ nanocrystals to remove capping ligands without sintering can permit enhanced charge extraction from photovoltaic devices with peak external quantum efficiencies exceeding 100%, which can be indicative of the generation and extraction of multiexcitons in the device (Stolle et al., *J. Phys. Chem. Lett.*, 5(2):304-309, 2014). Higher energy photonic curing can lead to nanocrystal sintering. Higher energy photonic curing of oleylamine-capped nanocrystals can lead to non-uniform sintered layers with extensive regions of exposed back contact. ChaM-capped nanocrystals can be sintered into relatively uniform layers.

$CuInSe_2$ nanocrystals can be synthesized by arrested precipitation following reported methods (Stolle et al., *J. Phys. Chem. Lett.*, 5(2):304-309, 2014). Briefly, 2 mmol of CuCl and 2 mmol of $InCl_3$ are added to a three neck flask under an inert atmosphere. 4 mmol of Se powder is dissolved in 1.5 mL diphenylphosphine and 2 mL oleylamine. The flask is attached to a standard Schlenk line and degassed at 110° C. for 30 minutes under vacuum. The flask is then purged with nitrogen and heated to 180° C. Once the flask reaches 180° C., the Se solution is injected and the flask is rapidly ramped to 240° C. and held for 30 minutes. The heating mantle is then removed and the flask is allowed to cool to room temperature. The nanocrystals are precipitated by adding excess ethanol and centrifugation at 4000 rpm. The nanocrystals are washed by precipitation using toluene/ethanol solvent/antisolvent pair.

CIS-ChaM [$(N_2H_4)_x(N_2H_5)_3(In_2Cu_2Se_4S_3)$] can be synthesized in hydrazine by established methods (Kovalenko et al., "Colloidal Nanocrystals with Molecular Metal Chalcogenide Surface Ligands," Science, 324(5933):1417-1420, 2009). CIS-ChaM is formed by mixing equal amounts of $Cu_2S$-ChaMs [$N_4H_9Cu_7S_4$] and $In_2Se_3$-ChaMs [$(N_2H_4)_2(N_2H_5)_2In_2Se_4$]. $Cu_2S$-ChaM is synthesized by dissolving 1 mmol of $Cu_2S$ and 1 mmol S powder in 4 mL of hydrazine. $In_2Se_3$-ChaM is synthesized by mixing 2.5 mmol $In_2Se_3$, 2.5 mL of 1M Se:$N_2H_4$ solution and 7.5 mL of additional hydrazine. CIS-ChaM is dried under nitrogen and redispersed in ~10 mL of N-methylformamide (all subsequent processing can be completed without the need for hydrazine). Oleylamine ligand exchange is carried out in N-methylformamide (Stolle et al., "Comparison of the Photovoltaic Response of Oleylamine and Inorganic Ligand-Capped $CuInSe_2$ Nanocrystals," ACS Appl. Mater. Interfaces, 4(5): 2757-2761, 2012; Jiang et al., "Soluble Precursors for $CuInSe_2$, $CuIn_{1-x}Ga_xSe_2$, and $Cu_2ZnSn(S,Se)_4$ Based on Colloidal Nanocrystals and Molecular Metal Chalcogenide Surface Ligands," J. Am. Chem. Soc., 134(11):5010-5013, 2012; Kovalenko et al., "Colloidal Nanocrystals with Molecular Metal Chalcogenide Surface Ligands," Science, vol. 324(5933):1417-1420, 2009). Typically, 2 mL of oleylamine-capped nanocrystals dispersed in toluene (~100 mg/mL) are mixed with 5 mL N-methylformamide and 0.3 mL of CIS-ChaMs dispersed in N-methylformamide and stirred overnight in an inert atmosphere. Nanocrystals are precipitated by adding 20 mL of acetonitrile and centrifuging at 4000 rpm and then redispersed in 5 mL N-methylformamide.

Example 2: Photonic Curing of Nanocrystals

Oleylamine-capped $CuInSe_2$ nanocrystals dispersed in toluene was spray cast onto Au-coated glass substrates heated to 80° C. and ChaM-capped nanocrystals dispersed in N-methylformamide is doctor-bladed onto Au-coated glass substrates heated to 250° C. Photonic curing was performed using a PulseForge 3300 (NovaCentrix). Samples were loaded into a stainless steel chamber with a quartz window and purged with nitrogen for 30 seconds. Samples were then cured with a single, 300 µs pulse with energies ranging from 1.0-3.5 J/cm², as measured by bolometer (NovaCentrix). SimPulse software (NovaCentrix) is used to calculate the temperature of the film during photonic curing.

Scanning electron microscopy (SEM) was performed using a Zeiss Supra 40 VP operated at 5 keV accelerating voltage. X-ray diffraction (XRD) was performed using a Rigaku R-Axis Spider diffractometer using Cu Kα radiation ($\lambda$=1.5418 Å) operated at 40 kV and 40 mA and an image-plate detector. 2D diffraction patterns were radially integrated using Rigaku 2DP software.

FIGS. 1A-1G show SEM images of a 1 µm thick film of oleylamine-capped $CuInSe_2$ nanocrystals before and after photonic curing. The as-deposited film (FIG. 1A) is relatively uniform with some small cracks and thickness variations. After pulsing at 1.6 J/cm² (FIG. 1B), the film remains largely unsintered, although some regions of the nanocrystal film begin to peel off the substrate. The nanocrystal films cured with pulse energies ranging from 2.1 to 3.5 J/cm² shown in FIGS. 1C-1F are all highly non-uniform, regardless of pulse energy used, with a significant amount of exposed back contact. The temperatures of the films were calculated using SimPulse (FIG. 1G). Local variations in thickness can lead to hot spots in the film due to the absorption of more light in those regions. These hot spots can nucleate the formation of melt balls in particular regions of the substrate that lead to exposed back contact. As the pulse energy was increased, the extent of nanocrystal sintering also increased (FIGS. 1C-F). Once the pulse conditions pushed the temperature of the film over the $CuInSe_2$ melting point of ~990° C., most of the film exhibited globular melt structures, as in FIG. 1F especially.

ChaM-capped $CuInSe_2$ nanocrystals were found to respond much differently to photonic curing than the oleylamine-capped nanocrystals. FIG. 2 shows SEM images of 1 µm thick films of CIS-ChaM-capped $CuInSe_2$ nanocrystals before and after photonic curing with pulse energies ranging from 1.0 to 2.8 J/cm². The film temperatures calculated with SimPulse for each pulse condition shown in FIG. 2G. The as-deposited film is relatively smooth (FIG. 2A) and the lowest energy, 1.0 J/cm² pulse has little effect on the film (peak temperature ~400° C., FIG. 2B). Higher pulse energies of 1.4 and 1.8 J/cm² (peak temperatures of ~600° C. and ~800° C., respectively, FIGS. 2C,D) lead to slight amount of sintering that was uniform across the substrate without any exposed back contact or melting structures. The film temperatures are too low to induce melting; however, curing temperature of 500° C. is hot enough to induce crystal growth of ChaM-capped nanocrystals heated in argon (Jiang et al., "Soluble Precursors for $CuInSe_2$, $CuInSe_2$, $CuIn_{1-x}GaxSe_2$, and $Cu_2ZnSn(S,Se)_4$ Based on Colloidal Nanocrystals and Molecular Metal Chalcogenide Surface Ligands," J. Am. Chem. Soc., 134(11):5010-5013, 2012). The crystal grains formed during photonic curing are much smaller than those formed during high-temperature annealing. The smaller grain size is likely due to the short heating times during photonic curing. At higher pulse energies of 2.3 and 2.8 J/cm² (peak temperatures of ~1000° C. and ~1200° C., respectively, FIGS. 2E and F), the nanocrystal films exhibit significant melting. Unlike the oleylamine-capped nanocrystals, however, there is little exposed back contact and the film adhesion appears to be much better.

FIG. 3 shows X-ray diffraction (XRD) of oleylamine-capped and ChaM-capped nanocrystals before and after photonic curing. Both oleylamine-capped and ChaM-capped $CuInSe_2$ nanocrystals exhibit narrowing of the diffraction peaks with increased photonic curing pulse energy, indicating that crystal grain growth has occurred. For oleylamine-capped nanocrystals, the (112) $CuInSe_2$ diffraction peak (FIG. 3B) is broad for films with no photonic curing and films treated with a 1.6 J/cm² pulse, which indicates that the grains are still primarily nanocrystalline for the low 1.6 J/cm² pulse energy.

When the pulse energy is increased, the (112) peak narrows considerably, which corresponds to the presence of large melt balls as seen in SEM (FIGS. 1C-F). For ChaM-capped nanocrystals, the crystal grains grow more gradually with increasing pulse energy (FIG. 3C). At 1.0 J/cm², there is only a small amount of peak narrowing. At 1.4 J/cm² and 1.8 J/cm², the peaks begin to narrow significantly, which corresponds to the sintering of the nanocrystals into larger grains without melting (FIGS. 2C and D). At the highest pulse energies of 2.3 J/cm$^2$ and 2.8 J/cm$^2$, the primary (112) peak continues to narrow towards the instrument resolution. At these pulse energies, the nanocrystals reach temperatures where nanocrystal melting is possible, leading to very large grains. The emergence of secondary peaks at 25.1° and 28.5° is also observed, which likely corresponds to the formation of wurtzite-phase CuInSe$_2$. Wurtzite is an unstable phase in bulk CuInSe$_2$, but can be stabilized in nanostructures (Steinhagen et al., "Solution-Liquid-Solid Synthesis of CuInSe$_2$ Nanowires and Their Implementation in Photovoltaic Devices," *ACS Appl. Mater. Interfaces*, 3(5):1781-1785, 2011; Norako et al., "Synthesis of Metastable Wurtzite CuInSe$_2$ Nanocrystals," *Chem. Mater.*, 22(5):1613-1615, 2010; Wang et al., "Synthesis of Monodispersed Wurtzite Structure CuInSe$_2$ Nanocrystals and Their Application in High-Performance Organic-Inorganic Hybrid Photodetectors," *J. Am. Chem. Soc.*, 132(35):12218-12221, 2010). In this case, the wurtzite phase may be kinetically trapped after nanocrystal melting due to the very rapid cooling of the film.

FIGS. 4A-D show SEM images of cross-sectioned ChaM-capped nanocrystal films. Prior to photonic curing, the nanocrystals are too small to be easily resolved by SEM (FIG. 4A). Curing the nanocrystal film at 1.8 J/cm$^2$ (FIG. 4B) leads to noticeable crystal grain growth; however, the crystal grain size is still nanometers in scale. The grain size is slightly larger near the surface of the film. Apparently, the nanocrystals near the surface of the film reach slightly higher temperature during the curing process. Higher pulse energies of 2.3 J/cm$^2$ (FIG. 4C) appear to increase the film temperature above the CuInSe$_2$ melting point and a layer of large CuInSe$_2$ crystal domains appear on the top of the film. Most of the film exhibits similar structure as the film cured at 1.8 J/cm$^2$. The film treated with 2.8 J/cm$^2$ pulse energy (FIG. 4D), forms even larger crystal grains, indicating that significant melting of the nanocrystals occurred. Unlike the oleylamine-capped nanocrystals, the melted CuInSe$_2$ layer remained adhered to the substrate in a relatively uniform layer. The film did also shrink considerably, due to the loss of void volume in the film.

Thus far, photovoltaic devices fabricated from CuInSe$_2$ nanocrystal films sintered by photonic curing have not exhibited significant improvements in device performance. Although short circuit currents are clearly improved by photonic curing of the nanocrystal layers, there has also been significant loss in open circuit voltage ($V_{oc}$) (Stolle et al., *J. Phys. Chem. Lett.*, 5(2):304-309, 2014).

Example 3: Nanocrystal Synthesis

A maximum of 34% of the energy available in sunlight can be converted to electricity by a single junction solar cell, known as the Shockley-Queisser limit (Henry et al., "Limiting Efficiencies of Ideal Single and Multiple Energy Gap Terrestrial Solar Cells," *J. Appl. Phys.* 51:4494-4500, 1980). The semiconductor in the device does not absorb photons with energy less than its band gap energy and photon energy greater than the band gap is lost as heat due to the rapid relaxation of the photoexcited electron and hole to their band minima before they can be extracted as electrical current. One way to surpass the Shockley-Queisser limit is to use quantum dots that convert high-energy photons into multiple electron-hole pairs that can be extracted as photocurrent by the device (Hanna et al., "Solar Conversion Efficiency of Photovoltaic and Photoelectrolysis Cells with Carrier Multiplication Absorbers," *J. Appl. Phys.* 100:074510, 2006; Beard et al., "Multiple Exciton Generation in Semiconductor Quantum Dots," *J. Phys. Chem. Lett.* 2:1282-1288, 2011). Colloidal nanocrystals can provide a convenient source of quantum dots in which multiexciton generation (MEG) can be observed optically from a host of materials, including PbS, PbSe, PbTe, CdSe, InAs, and Si (Schaller et al., "High Efficiency Carrier Multiplication in PbSe Nanocrystals: Implications for Solar Energy Conversion," *Phys. Rev. Lett.* 92:186601, 2004; Beard et al., "Multiple Exciton Generation in Colloidal Silicon Nanocrystals," *Nano Lett.* 7:2506-2512, 2007; Murphy et al., "PbTe Colloidal Nanocrystals: Synthesis, Characterization, and Multiple Exciton Generation," *J. Am. Chem. Soc.* 128:3241-3247, 2006; Lin et al., "Dependence of the Multiple Exciton Generation Rate in CdSe Quantum Dots," *ACS Nano* 5:2503-2511, 2011; Califano et al., "Direct and Inverse Auger Processes in InAs Nanocrystals: Can the Decay Signature of a Trion Be Mistaken for Carrier Multiplication?" *ACS Nano* 3:2706-2714, 2009). Extraction of more than one electron per absorbed photon as electrical current in devices has also been reported (Sukhovatkin et al., "Colloidal Quantum-Dot Photodetectors Exploiting Multiexciton Generation," *Science* 324:1542-1544, 2009; Kim et al., "Multiple Exciton Generation and Electrical Extraction from a PbSe Quantum Dot Photoconductor," *Appl. Phys. Lett.* 92:031107-031107-3, 2008; Kim et al., "Carrier Multiplication in a PbSe Nanocrystal and P3HT/PCBM Tandem Cell," *Appl. Phys. Lett.* 92:191107-191107-3, 2008; Gabor et al., "Extremely Efficient Multiple Electron-Hole Pair Generation in Carbon Nanotube Photodiodes," *Science* 325:1367-1371, 2009) with a few instances of device quantum efficiencies (QE) exceeding 100%—PbS (internal QE only) (Sambur et al., "Multiple Exciton Collection in a Sensitized Photovoltaic System," Science 330:63-66, 2010), PbSe (external QE) (Semonin et al., "Peak External Photocurrent Quantum Efficiency Exceeding 100% via MEG in a Quantum Dot Solar Cell," *Science* 334:1530-1533, 2011), nanocrystal solar cells and an organic device exhibiting a related process of singlet fission (Congreve et al., "External Quantum Efficiency Above 100% in a Singlet-Exciton-Fission-Based Organic Photovoltaic Cell," *Science* 340:334-337, 2013). PV devices of CuInSe$_2$ nanocrystals with multiexciton generation and extraction and peak external quantum efficiencies of just over 125% are herein demonstrated.

CuInSe$_2$ is an important model semiconductor for PV devices that is closely related to Cu(In$_x$Ga$_{1-x}$)Se$_2$ (CIGS), which holds the record for highest device efficiency of all thin film semiconductors at just over 20% (Jackson et al., "New World Record Efficiency for Cu(In,Ga)Se$_2$ Thin-film Solar Cells Beyond 20%," *Prog. Photovoltaics Res. Appl.* 19:894-897, 2011). PV devices made from ink-deposited CuInSe$_2$ nanocrystals have reached power conversion efficiencies of 3%, limited by poor charge transport (Akhavan et al., "Thickness-limited Performance of CuInSe$_2$ Nanocrystal Photovoltaic Devices," *Opt. Express* 18:A411-A420, 2010; Stolle et al., "Comparison of the Photovoltaic Response of Oleylamine and Inorganic Ligand-Capped CuInSe$_2$ Nanocrystals," *ACS Appl. Mater. Interfaces*, 4:2757-2761, 2012; Panthani et al., "CuInSe$_2$ Quantum Dot Solar Cells with High Open-Circuit Voltage," *J. Phys. Chem. Lett.* 4:2030-2034, 2013). Ink-deposited Cu(In$_x$Ga$_{1-x}$)S$_2$ nanocrystals can be sintered into polycrystalline films by heating (>500° C.) under selenium vapor (i.e., selenization) to achieve much higher efficiencies of just over 12% (Guo et al., "Ink Formulation and Low-temperature Incorporation of Sodium to Yield 12% Efficient Cu(In,Ga)(S,Se)$_2$ Solar Cells from Sulfide Nanocrystal Inks," *Prog. Photovoltaics*

Res. Appl. 21:64-71, 2012; Akhavan et al., "Influence of Composition on the Performance of Sintered Cu(In,Ga)Se$_2$ Nanocrystal Thin-Film Photovoltaic Devices," *ChemSusChem* 6:481-486, 2013). To try to avoid the need for high temperature selenization, an alternative nanocrystal film processing technique called photonic curing was used to improve charge transport in the nanocrystal film. Photonic curing was carried out using a PulseForge 3300 (NovaCentrix) tool that uses pulsed light from a flash lamp with Xenon fill gas with spectrally broad blackbody radiation that can produce very rapid heating to high temperature. Photonic curing can provide enough energy to sinter nanocrystals (Schroder, A. Mechanisms of Photonic Curing: Processing High Temperatures on Low Temperature Substrates. *Nanotech Conf. Expo* 2011 *Interdiscip. Integr. Forum Nanotechnol. Biotechnol. Microtechnology* 2), but in this study relatively mild pulse conditions were used to remove organic ligands and bring nanocrystals into better electrical contact without destroying their nanoscale dimensions. Nanocrystal films processed in this way can yield PVs with peak external quantum efficiencies (EQE) exceeding 100%, which can indicate the occurrence of multiple exciton generation (MEG) and extraction from the devices. Transient absorption spectroscopy was employed to verify that MEG does indeed occur in the nanocrystal films.

CuInSe$_2$ nanocrystals were synthesized according to previously reported methods (Panthani et al., "CuInSe$_2$ Quantum Dot Solar Cells with High Open-Circuit Voltage," *J. Phys. Chem. Lett.* 4:2030-2034, 2013). Briefly, 2 mmol of CuCl, 2 mmol of InCl$_3$, and 20 mL degassed OLA were loaded into a 3-neck flask inside an N$_2$-filled glovebox. DPP:Se solution was made by mixing 4 mmol each of Se powder and DPP and diluting with 2 mL OLA. The flask was sealed, removed from the glovebox, and attached to a Schlenk line. The reaction mixture was stirred and heated to 110° C. under vacuum for a 30 minute period. It was then blanketed with nitrogen and heated to 180° C. at which point the DPP:Se solution was injected. The flask was heated to 240° C. and held for 30 minutes before the heating mantle was removed, allowing it to cool to room temperature. The nanocrystals were precipitated with excess ethanol and centrifuged at 4000 rpm for 2 min. The supernatant was discarded and the precipitate was redispersed in 5 mL of toluene. The dispersion was centrifuged at 4000 rpm for 1 min to precipitate poorly-capped nanocrystals. The supernatant was transferred to a centrifuge tube. Ethanol was added dropwise until the mixture became slightly turbid. After centrifugation at 4000 rpm for 1 min the supernatant was discarded, and the precipitate was dispersed in toluene. The nanocrystal dispersion was stored in a N$_2$-filled glovebox.

Soda lime glass substrates (Delta Technologies) were cleaned by sonication for 10 minutes in 1:1 IPA/acetone followed by sonication in DI water for 10 minutes. 5 nm of Cr followed by 60 nm of Au (Kurt J. Lesker Co.) was then deposited by thermal evaporation. CuInSe$_2$ nanocrystals were spray-deposited on the Au-coated substrates in approximately 500 nm thick layers from toluene dispersions (~20 mg/ml).

PV Device Fabrication. Photonic curing was carried out on CuInSe$_2$ nanocrystal films spray-deposited on Au-coated substrates using a PulseForge 3300 (NovaCentrix). Films were loaded into a 2 inch thick cylindrical stainless steel chamber with a 7 inch diameter and a 6 inch diameter circular quartz window on the top surface. The chamber was purged with nitrogen for one minute, sealed, positioned in the center of the xenon lamp illumination area, and then pulsed. A single 160 µs light pulse was used on each film, and the pulse voltages varied from 500 to 640 V. The energy of each pulse was 2 J/cm$^2$ to 3 J/cm$^2$ as determined by bolometer (NovaCentrix) readings at the same position and distance from the xenon lamps. 10 pulses were measured at each pulse condition and averaged to determine energy input.

Devices were completed by depositing layers of CdS, ZnO, and ITO after the photonic curing process. A CdS layer (~20 nm thick) was deposited on the nanocrystal layer by drop casting 700 µL of CdS precursor solution (1.25 mL of 15 mM CdSO$_4$, 2.2 mL of 1.5 M thiourea, and 2.8 mL of 18 M NH$_4$OH in water) onto the CuInSe$_2$ film heated to 95° C. on a hot plate. The CuInSe$_2$ film was covered with an inverted Petri dish for two minutes while the reaction progressed. The substrate was then removed from the hot plate, rinsed with DI water, and dried under a compressed air stream. A 40 nm thick layer of ZnO followed by a 600 nm thick layer of ITO are deposited by RF-sputtering under a 2 mtorr Ar atmosphere.

Characterization. X-ray diffraction (XRD) was performed on a Rigaku R-Axis Spider diffractometer with an image-plate detector and using graphite monochromatized Cu Kα (λ=1.5418 Å) radiation operated at 40 kV and 40 mA. Data were collected on nanocrystal films with and without pulse treatment on Au-coated soda-lime glass substrates. Samples were placed at a 10° glancing angle and rotated at 1° per second for 10 min. 2D diffraction patterns were radially integrated using 2DP V. 1.0 Data Processing Software (Rigaku) for 2-Dimensional detectors with subtraction of background scattering. XRD was also performed on a Bruker-Nonius D8 advance θ–2θ powder diffractometer equipped with a Bruker Sol-X Si(Li) solid state detector and 1.54 Å radiation (Cu Kα). Data were collected at 0.01 increments of 2θ at a scan rate of 6°/min. Scanning electron microscopy (SEM) was performed on a Zeiss Supra 40 VP SEM operated at 5 keV accelerating voltage through an In-lens detector. Transmission electron microscopy (TEM) was performed on an FEI Tecnai G2 Spirit BioTwin microscopy operated at 80 kV. Thermogravimetric analysis (TGA) was collected using a Mettler-Toledo DCS/TGA instrument with a temperature ramp of 20° C./min under a N$_2$ flow. Fourier transform infrared spectroscopy (FTIR) was acquired using a Thermo Mattson Infinity Gold FTIR with a Harrick VariGART crystal. UV-Vis-NIR absorbance spectra were acquired using a Cary 500 spectrophotometer equipped with an integrating sphere to collect diffuse reflection and transmission. Transient absorption (TA) measurements were performed using an 800 nm, 35 fs pulse width, 2 kHz amplified Ti: sapphire laser. Pump pulses at 800 or 400 nm were spatially overlapped with a mechanically delayed white light probe that was produced by focusing 5% of the amplifier output into a 2-mm thick sapphire plate.

PV Device Testing. A Keithley 2400 general purpose source meter was used to collect current-voltage characteristics with and without exposure to a Xenon lamp solar simulator (Newport) equipped with an AM1.5G optical filter. The light source was calibrated with a NIST-calibrated Si photodiode (Hamamatsu, S1787-08). Neutral density filters with optical densities of 0.1, 0.3, 0.6, and 1.0 where used to measure PV characteristics at lower intensity light. External quantum efficiency (EQE) was measured using monochromatic light generated using a commercial monochromator (Newport Cornerstone 260 ¼M) chopped at 213 Hz and focused to a spot size of 1 mm diameter on the active region. EQE measurements were made with the device at zero bias at wavelengths ranging from 350 and 1200 nm in 10 nm increments using a lock-in-amplifier (Stanford Research Systems, model SR830) with and without a 50 mW/cm$^2$ white light bias. Monochromated light intensity was calibrated using calibrated photodiodes of silicon (Hamamatsu) and germanium (Judson) and white light bias intensity was measured with a thermopile (Newport 818P-020-12). Neutral density filters were used to reduce the monochromated and light bias intensity. For additional confirmation, external quantum efficiency measurements were also taken using a QEX10 Solar Cell Spectral Response Measurement System purchased commercially from PV Measurements, Inc. The system uses monochromatic light chopped at 100 Hz and is calibrated using Si and Ge diodes and shows repeatability of better than 0.6% for the 300-400 nm range and better than 0.3% for the 400-1000 nm range.

PV devices made by spray-depositing CuInSe$_2$ nanocrystals from toluene dispersions on Au-coated soda lime glass substrates followed procedures similar to Akhavanet al., (Akhavan et al., "Thickness-limited Performance of CuInSe$_2$ Nanocrystal Photovoltaic Devices," *Opt. Express* 18:A411-A420, 2010), but the nanocrystal films were cured (FIGS. 5A-5C) in a closed chamber with a quartz window with a single 160 µs light pulse with flux ranging from 2-3 J/cm$^2$ before adding the CdS buffer layer and top contact. Nanocrystal films pulsed with 2.2 J/cm$^2$ light reach about 600° C. within 1 ms, which removes oleylamine ligand but does not induce grain growth (See FIGS. 9-13).

Confirmation of Ligand Loss During Photonic Curing of Nanocrystal Films by TGA and FTIR. Loss of oleylamine capping ligands during photonic curing was confirmed by TGA and FTIR of the nanocrystal film. Oleylamine vaporizes from the nanocrystal film between about 150° C. and 400° C. The TGA data in FIG. 9 shows less mass loss in this temperature range from films that had been cured and there is systematically decreasing amount of mass loss from nanocrystal films treated with increasing pulse power. The FTIR data in FIG. 10 shows loss of the C-H stretch absorption feature after photonic curing which is representative of the oleylamine capping ligands.

Figure 11:
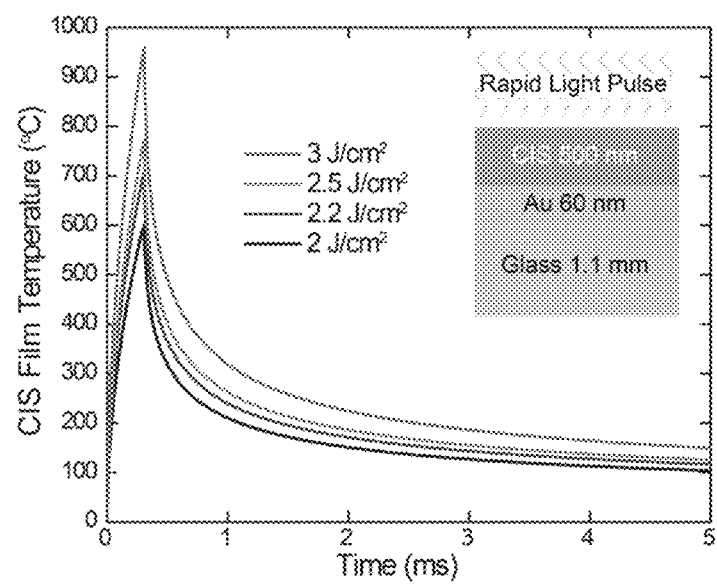
FIG. 11 shows the temperature of a 500 nm thick CuInSe$_2$ (CIS) nanocrystal layer on 60 nm thick Au on soda lime glass (1.1 mm thick) induced by a single (160 μs) photonic curing pulse (calculated using SimPulse software from NovaCentrix). In the graph the lines are ordered from bottom to top, 2, 2.2, 2.5, and 3 J/cm$^2$.

Calculated Substrate Temperature During Photonic Curing Process. FIG. 11 shows the calculated average temperature of a 500 nm thick CuInSe$_2$ nanocrystal layer on 60 nm thick Au on soda lime glass (1.1 mm thick) after a single (160 µs) pulse. The temperature was calculated using SimPulse software from NovaCentrix.

Extent of Nanocrystal Sintering after Photonic Curing Determined by XRD. The extent of nanocrystal sintering as a result of photonic curing was determined by examining X-ray diffraction peak widths. FIGS. 12A-12B show the (112) diffraction peak for chalcopyrite CuInSe$_2$. Decreasing peak width indicates an increase in crystal domain size. Using a Scherrer analysis, the as-deposited nanocrystals are 8.3 nm in diameter, which matches well with the size measured in TEM (FIGS. 12A-12B). After curing at 2.2 J/cm$^2$ and 2.5 J/cm$^2$, the nanocrystal size is 9.2 and 23.1 nm respectively. After curing at 3 J/cm$^2$ and 3.5 J/cm$^2$, the nanocrystals have sintered and the size is too large to calculate using Scherrer analysis.

FIGS. 6A-6I show scanning electron microscope (SEM) images of CuInSe$_2$ nanocrystal films before and after curing with 2.2 J/cm$^2$ and >3 J/cm$^2$ exposure. The nanocrystals remain small grains after 2.2 J/cm$^2$ exposure, but clearly grow into larger grains after >3 J/cm$^2$ exposure.

Although the nanocrystals could be grown into large grains by photonic curing, devices made from these sintered nanocrystals performed very poorly, as shown in FIGS. 6A-6I. Exposure of 3 J/cm$^2$ sintered the nanocrystals, but also led to dewetting by the formation of melt balls, leaving significant back contact exposed and devices with almost no short circuit current. In contrast, devices made with nanocrystals cured using 2.2 J/cm$^2$ exposure gave reasonable device response with power conversion efficiency (PCE) of 1.25%, similar to the devices made with as-deposited nanocrystals (PCE=1.19%). The biggest change in device response after photonic curing is a large increase in short circuit current ($J_{sc}$) and drop in open circuit voltage ($V_{oc}$), for example in FIG. 2G the $J_{sc}$, and $V_{oc}$, changed from 5.65 mA/cm$^2$ to 18.65 mA/cm$^2$ and 0.41 V to 0.21 V, respectively.

EQE (also known as IPCE) measurements showed that most of the increased short circuit current in the devices made with cured nanocrystals occurred in the short wavelength (<600 nm) range. FIG. 7A shows a comparison of EQE spectra from PVs made with as-deposited CuInSe$_2$ nanocrystals and nanocrystals that had been processed by photonic curing at 2.2 J/cm$^2$. The as-deposited CuInSe$_2$ nanocrystal device has a peak EQE of about 25%, whereas the peak EQE of the cured nanocrystal device is 123%. The device internal quantum efficiency (IQE) was also measured with a peak of 143% (see FIG. 14).

Figure 14:
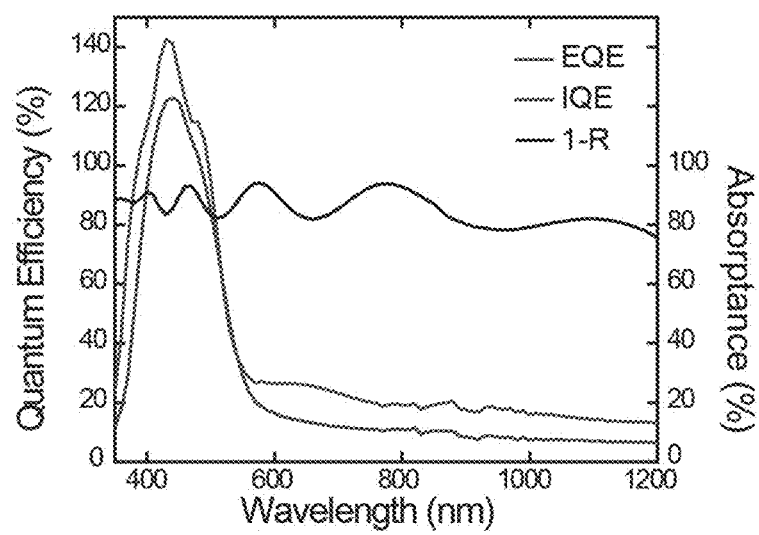
FIG. 14 shows the external quantum efficiency (dark grey), internal quantum efficiency (light grey), and absorptance (black) for a PV device made with CuInSe$_2$ nanocrystals and cured with a 2.2 J/cm$^2$ pulse.

Internal Quantum Efficiency and MEG Quantum Yield FIG. 14 shows the external quantum efficiency (EQE), internal quantum efficiency (IQE), and absorptance for a PV device made with CuInSe$_2$ nanocrystals cured with a 2.2 J/cm$^2$ pulse. The device absorptance is measured by UV-Vis with an integrating sphere to collect direct and diffuse reflectance and is given as 1−R, where R is the total device reflectance. IQE is calculated by dividing the device EQE by the absorptance. The peak EQE for this device is 123% and the peak IQE is 143%.

It was also found that the application of a white light bias can have a significant influence on the EQE spectra of the cured nanocrystal devices, which is usually not the case for the as-deposited nanocrystal devices (FIG. 7B).

The substantial effect of white light bias on the EQE of cured nanocrystal devices indicates that the curing process can introduce traps into the nanocrystal layer that hinder charge extraction under low light conditions (Hegedus et al., "Photoconductive CdS: How Does It Affect CdTe/CdS Solar Cell Performance?" *MRS Online Proc. Libr.*, 763:B9.5.1-B9.5.6, 2003; Gloeckler et al., "Apparent Quantum Efficiency Effects in CdTe Solar Cells," *J. Appl. Phys.*, 95:4438-4445, 2004). Because EQE measurements of solar cells are performed with a low-intensity monochromatic probe beam, the additional intense white light bias is required to mimic the near full sun conditions experienced by the device in the field (Sites et al., "Analysis of Apparent Quantum Efficiency," *Sol. Cells* 29:39-48, 1990), and EQE measurements taken without white light bias can give anomalous results (Hegedus et al., "The Photoresponse of CdS/CuInSe$_2$ Thin-Film Heterojunction Solar Cells," *IEEE Trans. Electron Devices* 31:629-633, 1984; Hegedus et al., "Photoconductive CdS: How Does It Affect CdTe/CdS Solar Cell Performance?" *MRS Online Proc. Libr.* 763: B9.5.1-B9.5.6, 2003; Gloeckler et al., "Apparent Quantum Efficiency Effects in CdTe Solar Cells," *J. Appl. Phys.* 95:4438-4445, 2004).

For example, traps in the CdS layer in CdTe/CdS devices usually filled under AM 1.5 illumination remain empty under low light conditions, significantly reducing device currents and leading to artificially low EQE values if white light bias is not used (Sites et al., "Analysis of Apparent Quantum Efficiency," *Sol. Cells* 29:39-48, 1990; Hegedus et al., "The Photoresponse of CdS/CuInSe$_2$ Thin-Film Heterojunction Solar Cells," *IEEE Trans. Electron Devices*, 31:629-633, 1984. Hegedus et al., *MRS Online Proc. Libr.*

763:B9.5.1-B9.5.6, 2003; Gloeckler et al., *J. Appl. Phys.* 95:4438-4445, 2004) CdTe and CIGS PV devices can also exhibit EQE variations with light bias intensity due to photoconductive CdS (Hegedus et al., *IEEE Trans. Electron Devices* 31:629-633, 1984; Hegedus et al., *MRS Online Proc. Libr.* 763:B9.5.1-B9.5.6, 2003; Gloeckler et al., *J. Appl. Phys.* 95:4438-4445, 2004; Demtsu et al., "Role of Copper in the Performance of CdS/CdTe Solar Cells," In *Conference Record of the 2006 IEEE 4th World Conference on Photovoltaic Energy Conversion;* 2006; Vol. 1, pp. 523-526). As discussed herein, the CdS layer is the same for all devices and the EQE of the as-deposited nanocrystal device is not affected by the white light bias intensity (FIG. 7B). But most telling is that the EQE of the devices with peak EQE>100% was found to decrease proportionally with the probe light intensity (FIG. 15, Table 1), additionally ruling out possible contributions from photoconductive gain or anomalous currents due to trapped carrier extraction related to the bias illumination.

Figure 15:
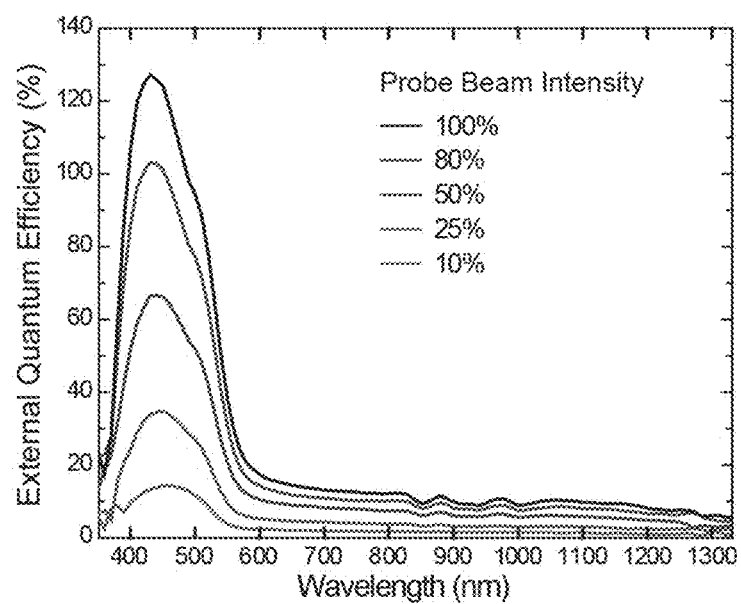
FIG. 15 shows the external quantum efficiency of a PV device made with CuInSe$_2$ nanocrystals cured at 2.2 J/cm$^2$. Neutral density filters are used to cut the monochromated probe beam to 100% (no filter, black), 80%, 50%, 25%, and 10% of its original intensity (this order is reflected in the lines in the graph from top to bottom). The white light bias intensity (~50 mW/cm$^2$) was the same for all measurements. Table 1 summarizes the peak EQE value and calculated $J_{sc}$.

TABLE 1 peak EQE and calculated $J_{sc}$ for each probe beam intensity from FIG. 15.

| Probe Beam Intensity (compared to maximum) | Peak EQE (%) | % Change in EQE | Calculated $J_{sc}$ (mA/cm$^2$) | % Change in Calculated $J_{sc}$ |
|---|---|---|---|---|
| 100% | 127 | | 14.3 | |
| 80% | 103 | 81% | 11.4 | 80% |
| 50% | 66 | 52% | 7.5 | 52% |
| 25% | 34 | 27% | 3.8 | 27% |
| 10% | 14 | 11% | 1.6 | 11% |

Effect of Light Biasing on EQE Measurements. External quantum efficiency (EQE) or incident photon-to-current efficiency (IPCE) measurements typically use a low-intensity monochromated probe beam to generate charge carriers in the device, which often does not represent true device performance under full sunlight (Gloeckler et al., "Apparent Quantum Efficiency Effects in CdTe Solar Cells," *J. Appl. Phys.* 95:4438-4445, 2004). EQE measurements should be acquired under realistic illumination conditions (i.e., under full sunlight) (Sites et al., "Analysis of Apparent Quantum Efficiency," *Sol. Cells* 29:39-48, 1990), and a white light bias with intensity near 100 mW/cm$^2$ is usually applied. The probe beam is passed through a chopper, and a lock-in amplifier is used to measure the current generated only by the probe beam and not by the unchopped bias light.

Figure 16:
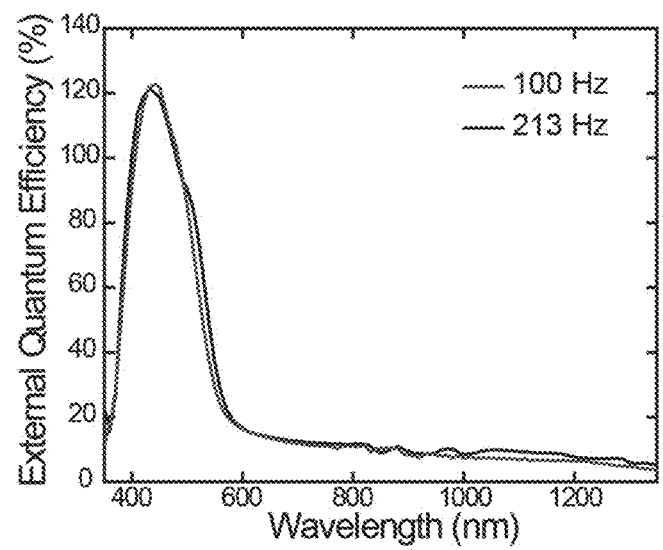
FIG. 16 shows the external quantum efficiency of a PV device made with CuInSe$_2$ nanocrystals cured at 2.2 J/cm$^2$ taken with two separate testing setups. The setup using the Newport monochrometer had a probe beam chopped at 213 Hz (black) and the commercial setup from PV Measurements, Inc. had a probe beam chopped at 100 Hz (grey).

There have been numerous discussions about anomalous EQE measurements (Gloeckler et al., *J. Appl. Phys.* 95:4438-4445, 2004; Sites et al., *Sol. Cells* 29:39-48, 1990. Demtsu et al., "Role of Copper in the Performance of CdS/CdTe Solar Cells," *Conference Record of the 2006 IEEE 4th World Conference on Photovoltaic Energy Conversion;* 2006; Vol. 1, pp. 523-526. Hegedus et al., "The Photoresponse of CdS/CuInSe$_2$ thin-film Heterojunction Solar Cells," *IEEE Trans. Electron Devices* 31:629-633, 1984; Hegedus et al., "Photoconductive CdS: How Does It Affect CdTe/CdS Solar Cell Performance?" *MRS Online Proc. Libr.* 763:B9.5.1-B9.5.6, 2003). One common anomalous result related to light biasing comes from photoconductive gain, as in vapor-deposited CdTe devices with photoconductive CdS layers (Demtsu et al., *Conference Record of the 2006 IEEE 4th World Conference on Photovoltaic Energy Conversion;* 2006; Vol. 1, pp. 523-526; Hegedus et al., *MRS Online Proc. Libr.* 763:B9.5.1-B9.5.6, 2003). Photoconductive gain can lead to an erroneously large EQE when a red light bias is applied (bias light with high energy photons removed by a filter) and the photocurrent is measured using blue probe light. In this case, the red bias light is not absorbed by the CdS layer and only generates charges in the CdTe film. The blue probe light is absorbed by the CdS layer and can modulate its conductivity. Photons generated by the red light bias can be more easily extracted when the CdS conductivity is increased by illumination with blue light. Thus, photoconductive gain in EQE occurs as the modulation of the CdS conductivity at the probe frequency causes charges not generated by the probe to be extracted and measured by the lock-in amplifier (Id.). This effect has also been reported for a white light bias in CdTe/CdS solar cells with the increase in EQE also attributed to modulation of the CdS layer (Demtsu et al., *Conference Record of the 2006 IEEE 4th World Conference on Photovoltaic Energy Conversion;* 2006; Vol. 1, pp. 523-526). Therefore, experiments were carried out to rule out the occurrence of photoconductive gain in the CuInSe$_2$ nanocrystal devices. Anomalous effects can also be observed if the charge carrier kinetics are slow compared to the chopping frequency, since such carriers may not be able to be extracted at the chopper frequency. EQE measurements were conducted on two different systems with two different frequencies (100 Hz and 213 Hz). The EQE is very similar, demonstrating that the measurements are not limited by charge carrier kinetics (FIG. 16).

The white light bias lamp in the EQE testing setup has an intensity of ~50 mW/cm$^2$ (about half the intensity AM 1.5 solar radiation) and the monochromated light intensity is only ~50 μW/cm$^2$, which is three orders of magnitude less than the bias light, making the modulation of the CdS conductivity very small compared to the conductivity increase from the bias lamp under standard white light bias. To confirm that photoconductive gain does not influence the measured EQE under white light bias, the EQE was measured under different probe beam intensity. Neutral density filters were used to cut the light intensity of the monochromated probe beam. In the absence of photoconductive gain, the reduction in the probe beam should yield a proportional reduction in peak EQE and $J_{sc}$. Photoconductive gain on the other hand results in a less significant decrease in peak EQE and $J_{sc}$, as charges generated by the bias light would still be measured. FIG. 15 shows EQE measurements of a cured nanocrystal sample with peak EQE>100% under white light bias. The monochromated probe is cut to 80%, 50%, 25%, and 10% of its original intensity using neutral density filters. The EQE and $J_{sc}$ match the expected values and the sample shows no photoconductive gain (See Table 1).

The EQE does not vary at different probe beam chopping frequencies (FIG. 16), which eliminates the possibility of anomalous effects due to slow carrier kinetics. Lastly, the measured $J_{sc}$ values of the CuInSe$_2$ nanocrystal devices in FIG. 6 agree pretty well with those calculated from the EQE measurements in FIGS. 7A-7B. The measured $J_{sc}$ from the as-deposited nanocrystal device was 5.65 mA/cm$^2$ compared to 4.95 mA/cm$^2$ calculated from EQE data. The cured nanocrystal device $J_{sc}$ is 18.65 mA/cm$^2$ (FIG. 6H) compared to 14.29 mA/cm$^2$ calculated from the EQE data. The lower calculated $J_{sc}$ value for the cured nanocrystal device results from the fact that the white light bias intensity in the IPCE setup was limited to ~50 mW/cm$^2$ and since the EQE of these devices was sensitive to the bias intensity the measured EQE under white light bias was still slightly lower than under true AM1.5 illumination at 100 mW/cm$^2$. To confirm that MEG does occur in the nanocrystal films with peak EQE>100%, the recombination dynamics of photoexcited excitons were determined by transient absorption (TA) spectroscopy with 400 nm and 800 nm pump light. FIGS. 8A-8B show the decay in bleach signal near the absorption edge (See FIG. 17 for a spectrum of the bleach signal) (Luther et al., "Multiple Exciton Generation in Films of Electronically Coupled Pb Se Quantum Dots," *Nano Lett.* 7:1779-1784, 2007; Stewart et al., "Comparison of Carrier Multiplication Yields in PbS and Pb Se Nanocrystals: The Role of Competing Energy-Loss Processes," *Nano Lett.* 12:622-628, 2012.)

Figure 17:
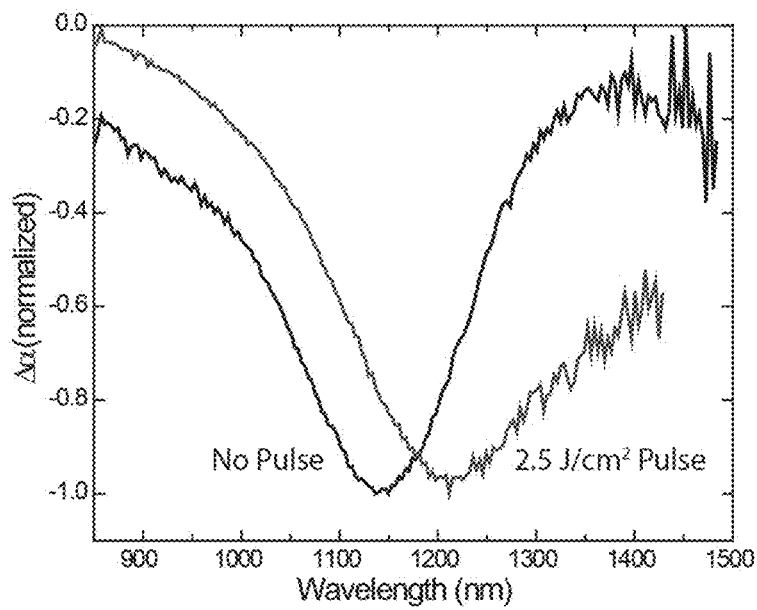
FIG. 17 shows transient absorption (TA) spectra showing the spectral peak in the bleach signal for a nanocrystal film without photonic curing (black) and a film cured with a 2.5 J/cm² pulse (grey). The peak location shift of ~70 nm may be due to a slight loss in quantum confinement after nanocrystal coupling (band gap reduction of ~0.06 eV). The cured film also shows a bleach peak that is broader into the red, which might be due to bleaching of band-to-trap transitions.
Figure 21:
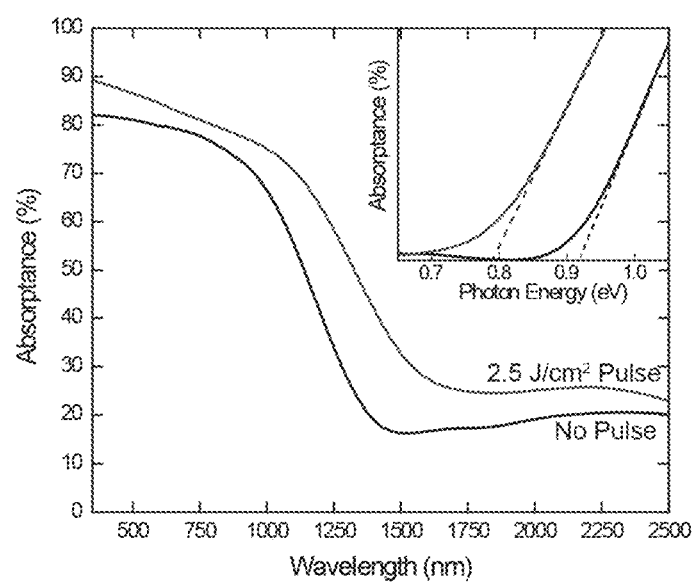
FIG. 21 shows absorptance measurements of a CuInSe₂ nanocrystal film before (black) and after photonic curing (grey, 2.5 J/cm²). Inset: Absorptance measured near the band edge; the dashed lines indicate the optical gap of each film: 0.91 and 0.79 eV for the nanocrystals before and after curing.

Transient Absorption Spectroscopy. FIG. 17 shows transient absorption (TA) spectra for $CuInSe_2$ nanocrystal films before and after photonic curing. The peak minimum corresponds to the optical gap and shifts to lower energy after photonic curing. The absorptance spectra (FIG. 21) of the $CuInSe_2$ nanocrystal films before and after curing also show a distinct red-shift of the optical gap after curing.

Figure 18:
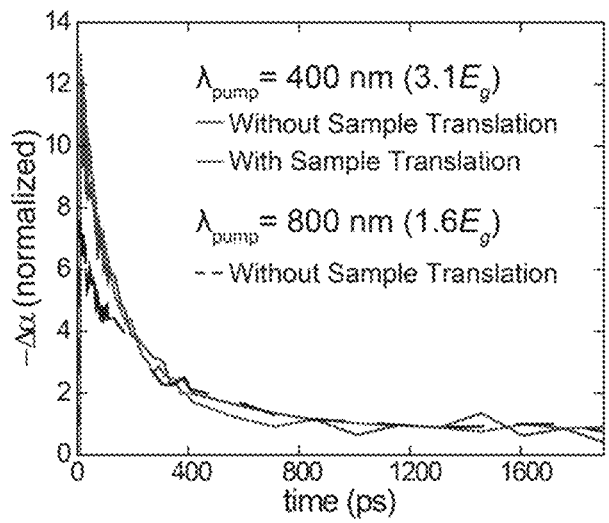
FIG. 18 shows transient absorption kinetics measured with and without sample translation and normalized to $-\Delta\alpha=1$ at 1 ns for a film photonically cured at 2.5 J/cm². The TA kinetics with and without sample translation look similar and both are characteristic of MEG (although the measurement with translation is noisier). Sample translation helps ensure that sample charging does not affect the TA signal.
Figure 20:
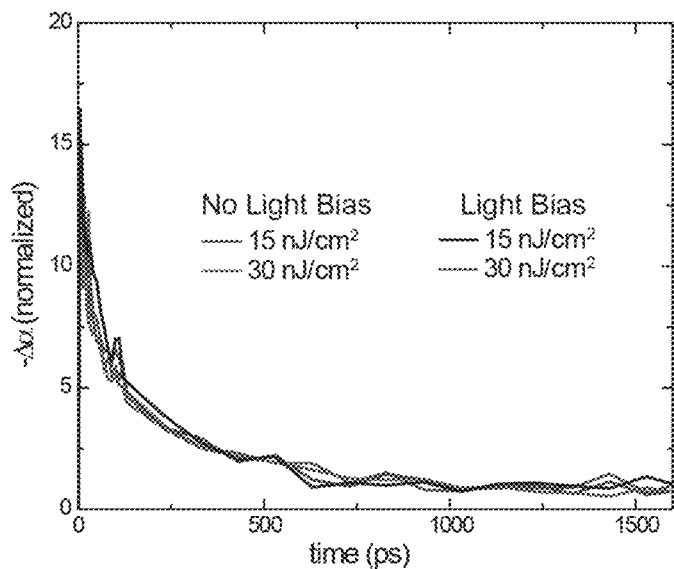
FIG. 20 shows transient absorption kinetics normalized to $-\Delta\alpha=1$ at 1 ns for a nanocrystal film cured at 2.5 J/cm². The kinetics were taken using 9 and 18 μJ/cm² pump fluences at 400 nm pump wavelength. For the black and grey curves, a light bias was applied to fill any trap states. All of the curves overlap and show few differences, indicating that multiexciton generation is produced irrespective of light biasing. However, because the light bias has a noticeable effect on device external quantum efficiency (see FIG. 15) trap-filling bias lamp plays a clear role in the extraction of multiexcitons.

Multiexcitons undergo Auger recombination (the inverse process to MEG) on very short time scales (typically ~100 ps) compared to much longer lived single excitons (Luther, et al., "Multiple Exciton Generation in Films of Electronically Coupled Pb Se Quantum Dots," *Nano Lett.* 7:1779-1784, 2007). With 800 nm pump light (FIG. 8A), an individual photon does not have enough energy to induce MEG and only one exciton per nanocrystal is generated at low pump fluence. Under these conditions, the normalized TA kinetics curves overlap. When the 800-nm pump fluence is increased so that some nanocrystals absorb more than one photon per excitation pulse, multiexcitons can be created and Auger recombination dynamics can be observed. The 400 nm pump photons carry about three times the band gap energy, so multiexciton generation from a single photon is possible and Auger recombination dynamics can be observed even at low fluences. FIG. 8B shows the bleach signal for two low-fluence TA kinetics with 400 nm pump wavelength as well as an average of the 3, 6, and 15 $\mu J/cm^2$ TA curves at 800 nm pump wavelength for comparison. The low fluence TA kinetics at 400 nm show increased signal at short times compared to the low fluence 800 nm pump TA kinetics, indicating the presence of Auger recombination and therefore multiexciton generation. The possibility of anomalous results due to photocharging was eliminated by rapidly translating the sample through the measurement area (McGuire et al., "Apparent Versus True Carrier Multiplication Yields in Semiconductor Nanocrystals," *Nano Lett.* 10:2049-2057, 2010). Negligible differences were observed between measurements of static and translating samples (FIG. 18). FIG. 18 shows TA spectra of $CuInSe_2$ nanocrystal films measured with and without sample translation. Samples can sometimes charge under the light beam, which can influence the TA spectra. The fact that the spectra overlap with and without sample translation indicate that there is no influence of sample charging on the TA spectra. FIG. 20 shows TA spectra acquired with and without an additional white light bias applied to the sample. There is no difference in the spectra, which indicates that trap-assisted recombination is not primarily responsible for the TA signal.

The average single exciton recombination kinetics at 800 nm pump and low fluence was used as a baseline to determine the Auger recombination rate. In FIGS. 8C-8D, the single exciton recombination background kinetics were subtracted (time constant ~600 ps) from the TA kinetics at 800 nm pump wavelength and 300 $\mu J/cm^2$ fluence (a high-power regime where multiple photons are present per absorbing nanocrystal) and at 400 nm pump wavelength and 9 $\mu J/cm^2$ fluence (in the regime of less than one photon per nanocrystal). The curves in FIGS. 8C-8D both fit single exponentials with similar time constants of 93 ps and 74 ps, respectively. The presence of Auger recombination at low fluences of 400 nm pump light supports the presence of MEG in the cured $CuInSe_2$ nanocrystal films and the quantum yield is estimated to be ~125% (See FIGS. 14 and 19).

Figure 19:
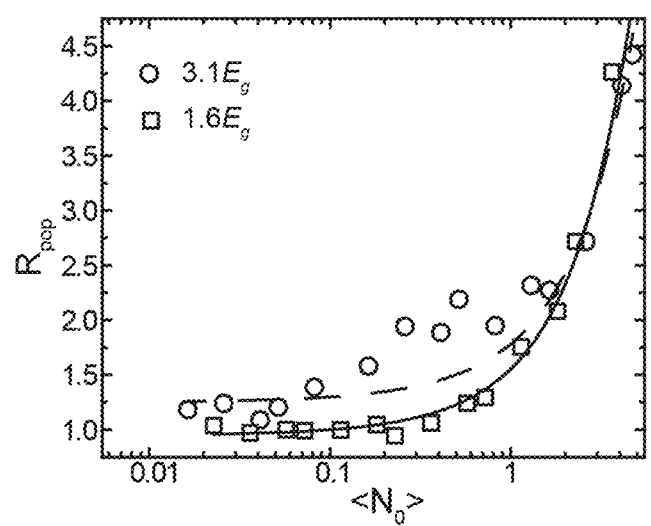
FIG. 19 shows the ratio of exciton population ($R_{pop}$) at early-time compared to late-time TA signal for high energy (circles, $3.1E_g$) and low energy (squares, $1.6E_g$) pump energy with varying exciton occupancy ($<N_0>$). The exciton population is normalized so that the exciton population at low energy pump is one in the limit of low pump fluence, since only a single exciton can be generated per nanocrystal. The data is fitted to the expected Poisson statistics for high energy (dashed line) and low energy (solid line) pump energy. The exciton population at the high energy pump is greater than one even in the limit of low pump fluence, which is indicative of MEG. The quantum yield is estimated to be ~125% at $3.1E_g$.

FIG. 19 shows the ratio of the TA signal at short time compared to long time at a range of pump fluences. The ratio, $R_{pop}$, is measured at low pump energy (1.6$E_g$) where only single excitons can be generated and at high pump energy (3.1$E_g$) where multiexcitons can possible be generated. The curves can be fitted with a Poisson distribution which follows the form, $R_{pop}=QY\sigma J[1-\exp(-\sigma J)]^{-1} R_{pop}=QY\sigma J[1-\exp(-\sigma J)]^{-1}$. QY is the quantum yield of the sample and can be determined by $R_{pop}$ in the limit of low pump fluence (J). The absorption cross section, $\sigma$, can be determined by fitting the data to the equation and can then be used to calculate the exciton occupancy, $<N_o>=\sigma J$. $R_{pop}$ is normalized to one in the limit of low pump fluence for the low energy pump, since only a single exciton can be generated per incident photon. The quantum yield at 3.1Eg is estimated to be ~125%.

The influence of the trap states limiting multiexciton extraction under low light conditions on the exciton decay dynamics was tested by applying an intense white light bias during TAS measurements, and there was little effect on the TA kinetics (See FIG. 20). The traps seem to have a detrimental effect only on charge extraction. Perhaps these traps are related to unpassivated surface defects (Ip et al., "Hybrid Passivated Colloidal Quantum Dot Solids," *Nat. Nanotechnol.* 7:577-582, 2012; Barkhouse et al., "Thiols Passivate Recombination Centers in Colloidal Quantum Dots Leading to Enhanced Photovoltaic Device Efficiency," *ACS Nano* 2:2356-2362, 2008; Konstantatos et al., "Engineering the Temporal Response of Photoconductive Photodetectors via Selective Introduction of Surface Trap States," *Nano Lett.* 8:1446-1450, 2008). TEM shows that prior to photonic curing the nanocrystals have a diameter of 8.1±2.1 nm, which is smaller than the Bohr exciton radius for $CuInSe_2$ (Castro et al., "Nanocrystalline Chalcopyrite Materials ($CuInS_2$ and $CuInSe_2$) via Low-Temperature Pyrolysis of Molecular Single-Source Precursors," *Chem. Mater.* 15:3142-3147, 2003). The red-shift of 60 meV in the peak wavelength of the absorption bleach in the TA spectrum (FIG. 17) after curing probably results from a loss of quantum confinement. However, the fact that the reduction in optical gap is larger than this (0.12 eV, FIG. 21) and that the TA spectrum exhibits an asymmetric broadening into the red part of the spectrum (FIG. 17) indicate that trap-related defects are present after photonic curing. In order to extract multiexcitons from a device, the photogenerated multiple electron-hole pairs must separate before Auger recombination can occur. CdTe and PbS nanocrystals both show charge transfer rates between nanocrystals of ~100 ps and biexcitons can be extracted from separate nanocrystals without Auger recombination (Sukhovatkin et al., "Colloidal Quantum-Dot Photodetectors Exploiting Multiexciton Generation," *Science* 324:1542-1544, 2009; Franzl et al., "Fast Energy Transfer in Layer-by-layer Assembled CdTe Nanocrystal Bilayers," *Appl. Phys. Lett.* 84:2904-2906, 2004. Lazarenkova et al., "Miniband Formation in a Quantum Dot Crystal," *J. Appl. Phys.* 2001, 89, 5509-5515. Trinh et al., "Direct Generation of Multiple Excitons in Adjacent Silicon Nanocrystals Revealed by Induced Absorption." *Nat. Photonics* 6:316-321, 2012. Tisdale et al., "Hot-Electron Transfer from Semiconductor Nanocrystals," *Science* 328:1543-1547, 2010). Charge transfer rates as fast as 50 fs have been observed in PbSe nanocrystals and reported for hot carrier extraction. (Tisdale et al., "Hot-Electron Transfer from Semiconductor Nanocrystals," *Science* 328:1543-1547, 2010). The calculated biexciton decay time in this example is similar to coupled PbSe quantum dot films (~100 ps), which have also demonstrated MEG in devices (Semonin et al., "Peak External Photocurrent Quantum Efficiency Exceeding 100% via MEG in a Quantum Dot Solar Cell," *Science* 334:1530-1533, 2011; Luther et al., "Multiple Exciton Generation in Films of Electronically Coupled Pb Se Quantum Dots," *Nano Lett.* 7:1779-1784, 2007). Enhanced coupling in films of PbSe nanocrystals can allow for efficient conversion of multiexcitons into free charge carriers compared to the competing Auger recombination process (Sandeep et al., "High Charge-carrier Mobility Enables Exploitation of Carrier Multiplication in Quantum-dot Films," *Nat. Commun.* 4:2360, 2013). In CIS nanocrystal films with organic ligands attached, charge carriers cannot rapidly dissociate by transferring to neighboring nanocrystals and multiexcitons are lost to Auger recombination (see FIG. 5B). However, attaining peak quantum efficiencies over 100% after photonic curing can indicate that nanocrystal coupling is sufficient for multiexcitons to dissociate and be extracted prior to recombination (see FIG. 5C).

Ink-deposited CuInSe$_2$ nanocrystal PVs treated by photonic curing can exhibit high short circuit currents and peak external quantum efficiencies of over 120% due to the extraction of multiexcitons in the high energy wavelength region of the solar spectrum. TAS measurements substantiate the claim of MEG in cured nanocrystal films. It appears that photonic curing brings the nanocrystals into better electrical contact to enable multiexciton extraction. Ligand removal, however, still appears to induce a significant amount of traps in the nanocrystal film, which reduces device performance, especially under low light conditions. Still, the coupled nanocrystals can more readily transfer charge and allow for rapid separation and extraction of multiexcitons. TAS measurements show little difference in multiexciton generation with and without light biasing, which indicates that surface traps only affect multiexciton extraction and not generation. Passivation of these surface traps could provide a route to high efficiency devices that utilize multiexciton generation and extraction along with reasonably efficient charge extraction for electrons and holes photoexcited closer to the band gap energy.

Example 4

Semiconductor nanocrystal inks are being developed to deposit photovoltaic device (PV) absorber materials under ambient conditions in high throughput roll-to-roll processes (Hillhouse et al., "Solar Cells from Colloidal Nanocrystals: Fundamentals, Materials, Devices, and Economics. *Current Opinion in Colloid & Interface Sci.* 2009, 14, 245-259; Akhavan et al., "Colloidal CIGS and CZTS nanocrystals: A precursor route to printed photovoltaics. *J Solid State Chem.* 2012, 189, 2-12). However, nanocrystal PVs have thus far exhibited relatively low efficiency (<7%) (Ip et al., "Hybrid Passivated Colloidal Quantum Dot Solids. *Nature Nanotech.* 2012, 7, 577-582) without an additional thermal sintering process of the nanocrystal layer (Stolle et al., "Nanocrystal Photovoltaics: A Review of Recent Progress. *Current Opinion in Chemical Engineering* 2013, 2, 160-167). Sintered nanocrystal layers have achieved higher device efficiency— for example, Cu(In,Ga)S$_2$ nanocrystals selenized at 500° C. have yielded devices with >12% efficiency (Guo et al., "Ink Formulation and Low-temperature Incorporation of Sodium to Yield 12% Efficient Cu(In,Ga)(S,Se)$_2$ Solar Cells from Sulfide Nanocrystal Inks. *Progress in Photovoltaics: Research and Applications* 2013, 1, 64-71)—but the additional high temperature processing step increases manufacturing cost and process complexity. A variety of rapid thermal treatments with the potential for high throughput manufacturing have been explored to improve PV performance of vacuum-deposited and nanocrystal absorber layers. Rapid thermal annealing (RTA) of vapor-deposited CIGS has been reported to increase the efficiency from 9.5% to 15.8% by reducing defects and lowering recombination losses near the junction, although large performance increases were not seen in PV's with better initial efficiencies (Wang et al., "Investigation of Rapid Thermal Annealing on Cu(In,Ga)Se$_2$ Films and Solar Cells. *Solar Energy Materials and Solar Cells* 2006, 90, 2855-2866). Similar observations were reported in vapor-deposited CIGS films treated with pulsed laser annealing (PLA) (Wang et al., "Investigation of Pulsed Non-melt Laser Annealing on the Film Properties and Performance of Cu(In,Ga)Se$_2$ Solar Cells. *Solar Energy Materials and Solar Cells* 2005, 88, 65-73). PLA has been used to densify PbSe nanocrystal films (Baumgardner et al., "Pulsed Laser Annealing of Thin Films of Self-Assembled Nanocrystals. *ACS Nano* 2011, 5, 7010-7019), but no improved electrical performance was reported. PLA of stacked vapor-deposited layers of Cu, In, and Se to fabricate CuInSe$_2$ films has been explored, but reported to suffer from the formation of binary impurity phases (Bhattacharyy et al., "Detection of Binary Phases in CuInSe$_2$ Films Formed by Laser Annealing of Stacked Elemental Layers of In, Cu and Se. *J Mater. Sci.* 1996, 31, 5451-5456). Photonic curing, also known as pulse thermal processing or intense pulsed light (IPL) melting, was used to sinter ball-milled Cu(In,Ga)Se$_2$ particles on glass substrates using intense broad-band light pulses with energy inputs of 20-50 J/cm$^2$ (Dhage et al., "*Journal of Physics and Chemistry of Solids* 2010, 71, 1480-1483). Recrystallization of large grain CIGS was observed with no phase segregation; however, sintering on glass coated with metal back contacts, as needed for device fabrication, was not reported. Pastes of ethylene glycol dispersed CuIn$_{0.7}$Ga$_{0.3}$ and Se nanoparticles were exposed to 5-20 J/cm$^2$ IPL treatments to form CIGS films on glass substrates, but the films retained a significant amount of unreacted CIG metal—similar IPL experiments were not performed on substrates with metal back contacts (Dhage et al., "Cu(In,Ga)Se$_2$ Thin Film Preparation from a Cu(In,Ga) Metallic Alloy and Se Nanoparticles by an Intense Pulsed Light Technique. *J. Electron Mater.* 2011, 40, 122-126). A photonic curing process using microsecond broad-band light pulses to sinter CuInSe$_2$ and CdTe nanocrystals on substrates with metal back contacts was used.

Photonic curing was performed using a Novacentrix PulseForge 3300 tool (Schroder, K. A. Mechanisms of Photonic Curing™: Processing High Temperature Films on Low Temperature Substrates, *Nanotech* 2011: *Electronics, Devices, Fabrication, MEMS, Fluidics and Computational*, Chapter 4, vol. 2 2011, pgs. 220-223) capable of providing high power microsecond pulses on layers of CuInSe$_2$ and CdTe nanocrystals spray-deposited on various back contact layers (Au, Mo, MoSe$_2$-coated Mo, and ITO). Pulse durations as short as 160 µs were utilized to control the total energy input and achieve the relatively low-energy, non-equilibrium, heating conditions needed to ensure the integrity of the back contact while exceeding the power threshold required to sinter the films. With very short pulses, extremely high temperatures of up to 1000° C. can be reached without damaging the underlying substrate (Schroder, K. A. Mechanisms of Photonic Curing™: Processing High Temperature Films on Low Temperature Substrates, *Nanotech* 2011: *Electronics, Devices, Fabrication, MEMS, Fluidics and Computational*, Chapter 4, vol. 2 2011, pgs. 220-223). Very rapid heating using high power light pulses might enable CIGS nanocrystal sintering while preserving film stoichiometry and avoiding Se loss. Device improvement has previously been observed in sputtered CdTe sputtered devices after photonic curing (Murray et al., "Flexible solar cells in milliseconds: Pulse Thermal Processing of CdTe devices. In 2011 37*th IEEE Photovoltaic Specialists Conference (PVSC)*; June; pp. 003327-003329). Devices made with sputtered CdTe layers on Kapton exhibited device efficiencies of 1.5% after photonic curing with no damage to the plastic substrate (Murray et al., "Flexible solar cells in milliseconds: Pulse Thermal Processing of CdTe devices. In 2011 37*th IEEE Photovoltaic Specialists Conference (PVSC)*; June; pp. 003327-003329). A PV device made with a photonically cured $CuInSe_2$ nanocrystal film is disclosed herein. Devices fabricated on $MoSe_2$-coated Mo back contacts retained sufficient integrity after photonic curing to obtain a PV response. These cured nanocrystal films exhibited increased photocurrent, but very low open circuit voltage ($V_{oc}$) due in part to significant regions of exposed back contact.

$CuInSe_2$ nanocrystals were synthesized using reported methods (Stolle et al., "Comparison of the Photovoltaic Response of Oleylamine and Inorganic Ligand-Capped $CuInSe_2$ Nanocrystals. *ACS Appl. Mater. Interfaces* 2012, 4, 2757-2761). In a typical synthesis, 0.198 g CuCl, 0.442 g $InCl_3$, 0.316 g Se, and 20 mL oleylamine are combined in a three neck flask and attached to a Schlenk line. The reaction mixture is degassed by pulling vacuum at 100° C. for 30 min, and then the temperature is raised to 200° C. for 30 min, and the temperature is further raised over the course of 5 min to 260° C. and held for 10 min. The heating mantle is removed to cool the reaction mixture to room temperature.

CdTe nanocrystals are synthesized using a modification of the procedure reported in Jasieniak et al. Solution-Processed Sintered Nanocrystal Solar Cells via Layer-by-Layer Assembly. *Nano Lett.* 2011, 11, 2856-2864. To a three neck flask, 0.48 g CdO, 0.24 g Te, 4.5 ml oleic acid, 20 mL octadecene, and 10 mL tributylphosphine are added. The flask is attached to a Schlenk line and heated to 80° C. under vacuum. The flask is flushed with nitrogen and then heated to 260° C. Once the temperature reaches 260° C., the heating mantle was removed and the reaction is allowed to cool to room temperature.

$CuInSe_2$ and CdTe nanocrystals are purified by precipitation using toluene/ethanol as the solvent/antisolvent pair in glass centrifuge tubes. The nanocrystals are precipitated with ~20 ml of ethanol and centrifuging at 4000 rpm for 2 minutes. The nanocrystals were redispersed in ~5 ml of toluene and centrifuged at the same conditions to separate the poorly-capped particles. The precipitate is discarded. The supernatant was redispersed in 5 mL toluene. After another precipitation with ethanol, the dispersion was centrifuged. The precipitate was redispersed in 5 mL of toluene and stored in a glovebox prior to use.

Mo-, ITO-, and Au-coated soda lime glass substrates. Bare and ITO-coated glass substrates (Delta Technologies) were sonicated in 1:1 IPA/acetone for 10 minutes followed by sonication in DI water for 10 minutes. Bare glass substrates were cleaned with oxygen plasma (March Plasma CS1701F RIE) at 200 W for 2 minutes. Mo (99.95% Lesker, UHP Ar sputtering gas) was deposited by rf-sputtering in a two-step process. A 400 nm thick adhesive Mo layer was sputtered at 5 mtorr, followed by a conductive 600 nm layer at 1.5 mtorr.

A surface layer, 200 nm thick, of $MoSe_2$ on Mo back contact was prepared by annealing Mo-coated soda-lime glass at 450° C. for 10 minutes under Se vapor as previously described (Akhavan et al., "Influence of Composition on the Performance of Sintered $Cu(In,Ga)Se_2$ Nanocrystal Thin-Film Photovoltaic Devices," *ChemSusChem* 2013, 6, 481-486). Mo coated substrates were enclosed in a graphite cylinder with Se pellets. The cylinder was sealed and placed in a tube furnace under Ar. The temperature was ramped at 50° C./min to 450° C. and held for 10 minutes. Gold substrates were prepared by thermal evaporation of 5 nm of Chromium followed by 60 nm of Au onto cleaned soda-lime glass substrates.

Nanocrystal Deposition. $CuInSe_2$ and CdTe nanocrystal films approximately 1 µm thick were deposited by spray-coating from toluene dispersions (~50 mg/mL). Prior to photonic curing, some CIS nanocrystal films were annealed at 475° C. under Ar for 1 hr and some CdTe films were briefly submerged in a saturated solution of $CdCl_2$ in methanol at 60° C. and then rinsed with isopropanol.

Photonic Curing. Photonic curing was performed with a PulseForge 3000 (Novacentrix) tool using pulse energies ranging from 1 $J/cm^2$ to 7 $J/cm^2$. Pulse energy is controlled by varying the pulse voltage and the reported energy inputs were measured with a bolometer (Novacentrix BX-100) ranged. For photonic curing, substrates were loaded into a stainless steel chamber with 2" thickness and 7" diameter and a 6" diameter circular quartz window. The chamber was purged with nitrogen for one minute and sealed. The chamber was positioned in the center of the xenon lamps and pulsed. A single light pulse with duration of either 160 or 300 µs was used. After photonic curing, the chamber was opened in a fume hood.

Materials Characterization. X-ray diffraction (XRD) data were collected on a Rigaku R-Axis Spider diffractometer with an image-plate detector and using graphite monochromatized Cu Kα ($\lambda$=1.5418 Å) radiation operated at 40 kV and 40 mA. Samples were placed at a 10° glancing angle and rotated at 1° per second for 10 min. Two-dimensional diffraction patterns were radially integrated using 2DP V. 1.0 Data Processing Software (Rigaku) for 2-Dimensional detectors with subtraction of background scattering. XRD was also performed on a Bruker-Nonius D8 advance θ−2θ powder diffractometer equipped with a Bruker Sol-X Si(Li) solid state detector and 1.54 Å radiation (Cu Kα). Data were collected at 0.01 increments of 2θ at a scan rate of 6°/min.

Scanning electron microscopy (SEM) was performed on a Zeiss Supra 40 VP SEM operated at 5 keV accelerating voltage through an In-lens detector. Energy-dispersive X-ray spectroscopy (EDS) was carried out on a Quanta 650 FEG SEM equipped with a Bruker)(Flash EDS Detector 5010. EDS maps were generated at 20 kV accelerating voltage and a working distance of 10 mm with a spot size of 5.

PV Device Fabrication. A CdS layer (50 nm thick) was deposited on cured $CuInSe_2$ nanocrystal films by chemical bath deposition by heating 160 mL of DI water to 70° C. 25 mL of 15 mM $Cd(SO_4)_2$, 12.5 mL of 1.5 M thiourea, and 32 mL of ammonia hydroxide (28 wt %) were added and the films were immersed for 15 minutes. A 50 nm ZnO layer followed by 600 nm of ITO was then deposited by rf-sputter coating at 2 mtorr. The device was defined by depositing the ZnO and ITO window layers through physical shadow masks to provide an active region of 0.08 $cm^2$.

Electrical measurements were performed using a Keithley 2400 general purpose source meter. PV device response was measured using a Xenon lamp solar simulator (Newport) equipped with an AM1.5G optical filter. The light source was calibrated with a NIST-calibrated Si photodiode (Hamamatsu, S1787-08).

Results and Discussion

Photonic Curing of $CuInSe_2$ nanocrystal films on Mo-coated soda-lime glass. Photonic curing was carried out by exposing a $CuInSe_2$ nanocrystal film to a single pulse (160 or 300 µs) of high-intensity light from a Xe lamp. FIGS. 22A-2H show SEM and XRD data for $CuInSe_2$ nanocrystal films before and after photonic curing with a 160 µs pulse (4.3 $J/cm^2$). The (112) diffraction peak for chalcopyrite $CuInSe_2$ at 2θ=26.65° narrowed significantly, indicating that sintering and crystal growth occurred. Photovoltaic device structures fabricated using the pulsed $CuInSe_2$ nanocrystals on Mo-coated soda-lime glass as the absorber layer, however, exhibited ohmic IV response without any measureable photocurrent. SEM (FIGS. 2A-2C) revealed that the sintered $CuInSe_2$ nanocrystal layer dewets the Mo surface and creates large sintered domes with significant regions of exposed Mo back contact that short the devices. Similar agglomeration of the sintered nanoparticles was observed at pulse energies as low as 2 $J/cm^2$.

Thermal modeling conducted by Schroder et al. (Schroder, K. A. Mechanisms of Photonic Curing™: Processing High Temperature Films on Low Temperature Substrates, *Nanotech* 2011: *Electronics, Devices, Fabrication, MEMS, Fluidics and Computational*, Chapter 4, vol. 2 2011, pgs. 220-223) of thin films treated with photonic pulses indicate that cohesive failure of films can result due to gas generation within the film. Oleylamine (OLA) capping ligands are vaporized from the film during the photonic curing process. This loss of ligands can destabilize the film and lead to dewetting. $CuInSe_2$ particle agglomeration from photonic curing can be reduced by annealing the films in Ar before pulse treatment to remove the ligands (FIG. 22H). These nanocrystal films did not dewet and agglomerate during photonic curing.

Figure 22:
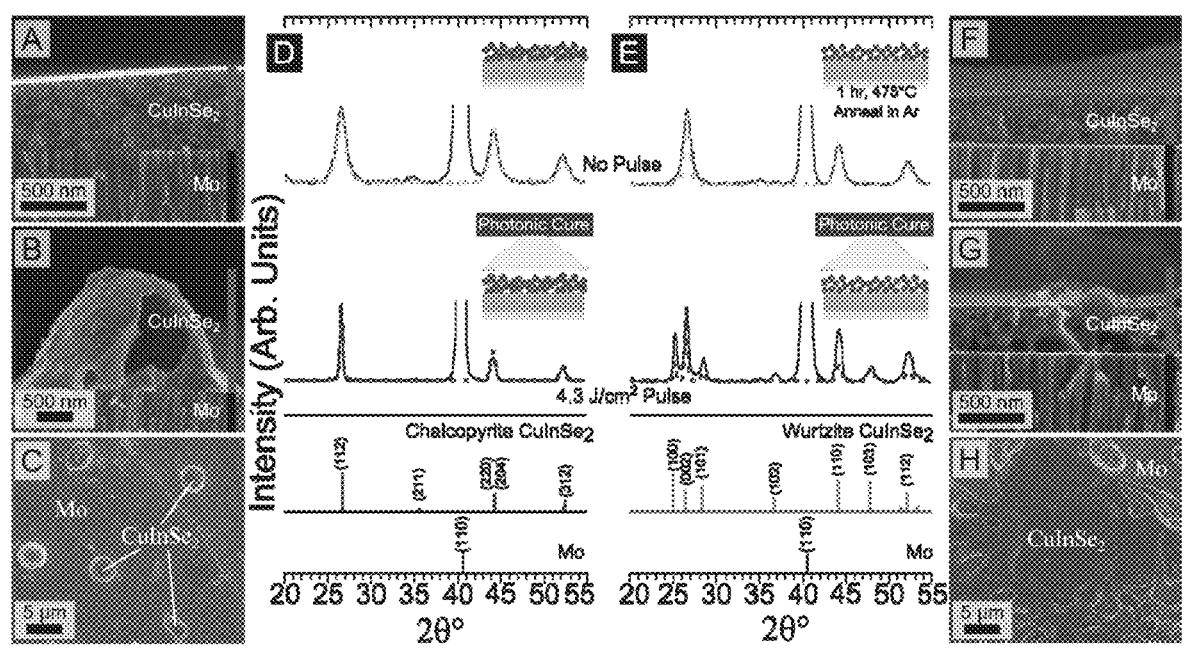
FIGS. 22A-22H show SEM images and XRD of CuInSe₂ nanocrystal films on Mo-coated soda lime glass after photonic curing with a 160 μs pulse with 4.3 J/cm² fluence. The data in FIGS. 22E-22H correspond to nanocrystals that were annealed under Ar for 1 hr at 475° C. prior to photonic curing.

XRD in FIG. 22 shows that $CuInSe_2$ nanocrystal films pre-treated by annealing in Ar had hexagonal crystal structure on both Mo substrates and soda-lime glass after photonic curing. High temperature selenization of $CuInSe_2$ nanocrystal films results in the room temperature stable chalcopyrite (tetragonal) phase (Park, J. S. et al., "$CuInSe_2$ Phase Formation During $Cu_2Se/In_2Se_3$ Interdiffusion Reaction," *J. Appl. Phys.* 2000, 87, 3683-3690). Wurtzite $CuInSe_2$ has been recently observed in nanocrystals (Norako, M. E. et al., "Growth Kinetics of Monodisperse Cu—In—S Nanocrystals Using a Dialkyl Disulfide Sulfur Source," *Chem. Mater.* 2009, 21, 4299-4304; Norako, M. E. et al., "Synthesis of Metastable Wurtzite $CuInSe_2$ Nanocrystals," *Chem. Mater.* 2010, 22, 1613-1615; Wang, J.-J. et al., "Synthesis of Monodispersed Wurtzite Structure $CuInSe_2$ Nanocrystals and Their Application in High-Performance Organic-Inorganic Hybrid Photodetectors," *J. Am. Chem. Soc.* 2010, 132, 12218-12221), nanodiscs (Koo, B. et al., "Wurtzite-Chalcopyrite Polytypism in $CuInS_2$ Nanodisks," *Chem. Mater.* 2009, 21, 1962-1966), and nanowires (Steinhagen, C. et al., "Solution-Liquid-Solid Synthesis of $CuInSe_2$ Nanowires and Their Implementation in Photovoltaic Devices," *ACS Appl. Mater. Interfaces* 2011, 3, 1781-1785). The crystal structure of the pulsed film exhibits polytypism, with both wurtzite and chalcopyrite phases present. Without ligand stabilization of the nanocrystals, it is probable that rapid light pulsing leads to stacking faults and mixed wurtzite/chalcopyrite diffraction.

$CuInSe_2$ on $MoSe_2$-coated Mo back contacts. Agglomeration of the $CuInSe_2$ nanocrystals during sintering is also reduced by using either $MoSe_2$-coated Mo or Au back contacts. Ghosh et al. (Ghosh et al., "A Novel Back-contacting Technology for Thin Films," *Semicond. Sci. Technol.* 1996, 11, 1358) has explained that the difference in thermal expansion between Mo and $CuInSe_2$ can lead to poor adhesion during the high temperature treatments used in co-evaporation processes. In addition to mismatched thermal expansion, photonic curing generates large thermal gradients in the film due to the brevity of the pulse, allowing the nanocrystal film to reach high temperatures while the underlying back contact remains at a lower temperature. The temperature mismatch would also destabilize the film. On Mo substrates, the vaporization of the ligand on pulsing destabilizes the film, contributing to de-wetting of the $CuInSe_2$ particles; however $MoSe_2$-coated Mo has sufficiently good adhesion with $CuInSe_2$ to prevent cohesive failure. Partial conversion of Mo to $MoSe_2$ during the standard high temperature selenization process increases adhesion between $CuInSe_2$ and Mo (Kohara, N. et al., "Electrical Properties of the $Cu(In,Ga)Se_2/MoSe_2/Mo$ Structure," *Solar Energy Materials and Solar Cells* 2001, 67, 209-215). The $MoSe_2$ layer is also important for device performance as it eliminates the Schottky barrier between CIGS and the Mo back contact in PV devices (Kohara, N. et al., "Electrical Properties of the $Cu(In,Ga)Se_2/MoSe_2/Mo$ Structure," *Solar Energy Materials and Solar Cells* 2001, 67, 209-215). $MoSe_2$ does not form during the photonic curing process; therefore, a top layer of $MoSe_2$ on the Mo back contact was created prior to depositing the $CuInSe_2$ nanocrystals.

Figure 23:
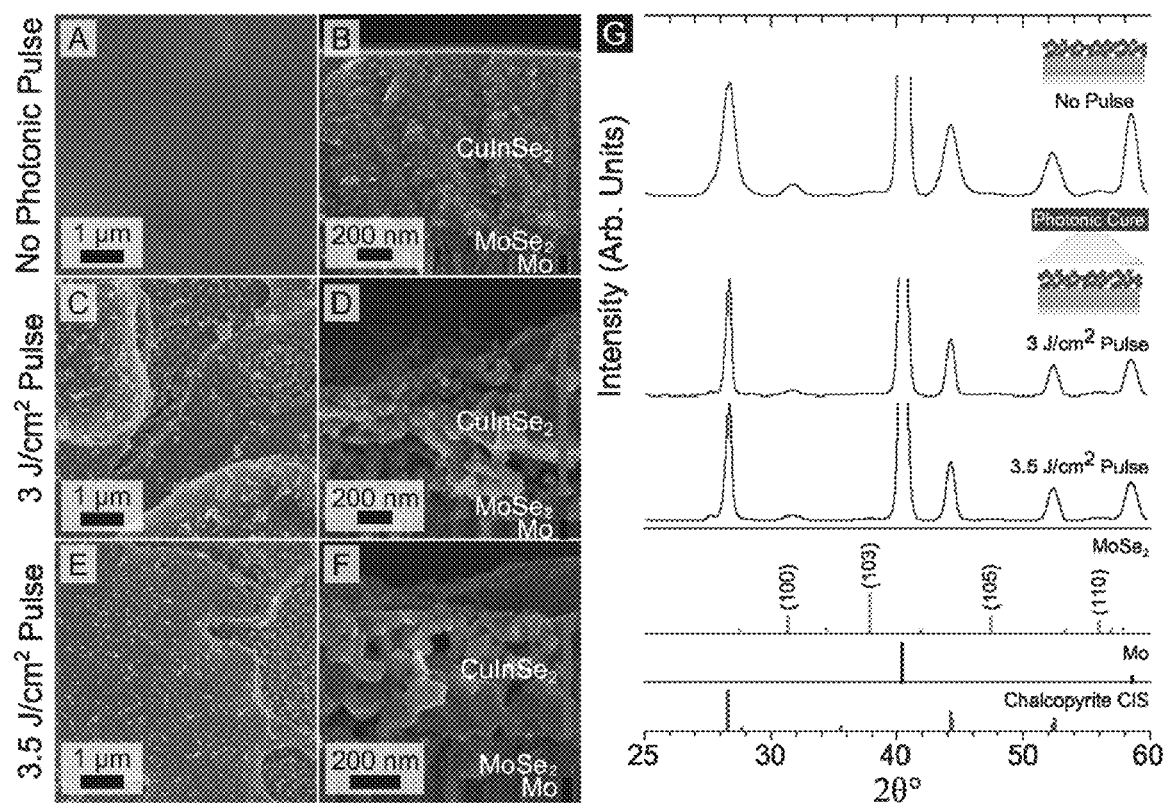
FIGS. 23A-23G show-SEM images of CuInSe₂ nanocrystals on Mo back contacts with an MoSe₂ top layer. Spatial (FIG. 23A) and cross sectional (FIG. 23B) SEM of films with no photonic treatment.

The XRD peaks narrow after photonic curing of the nanocrystal film (on $MoSe_2$/Mo back contacts). FIG. 23G shows the (112) peak narrowing of cured $CuInSe_2$ layers. The extent of sintering and recrystallization depends on the pulse energy. Dewetting of sintered CIS aggregates is significantly reduced on $MoSe_2$ compared to Mo (FIGS. 23A, 23C, 23E). There is still coalescence of nanocrystals that leads to exposed back contact; however, the majority of the film is covered with absorber layer unlike films treated on Mo. Under high power pulse conditions that result in large agglomerates, solid and hollow hemispheres of sintered $CuInSe_2$ are observed. The hemispherical shapes likely form during rapid cooling in areas where local heating reached the $CuInSe_2$ melting point.

Figure 24:
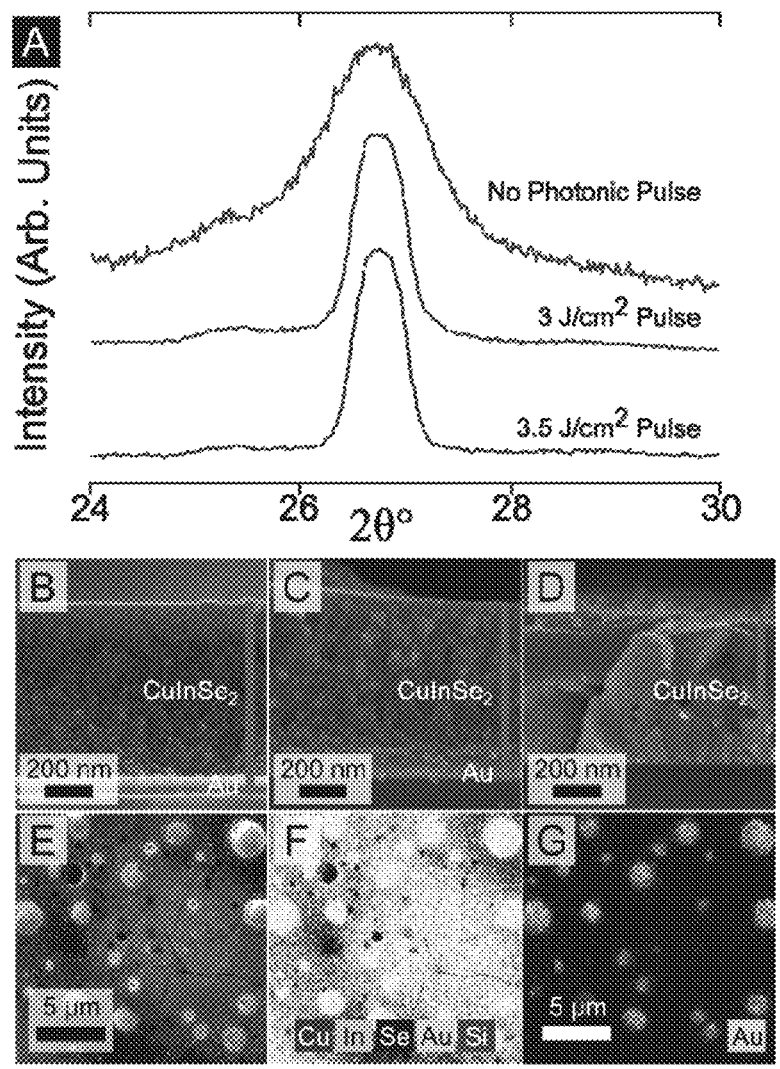
FIGS. 24A-24G show-XRD of CIS (112) peak before and after photonic curing with 3 and 3.5 J/cm² pulses (300 μs) of nanocrystal films deposited on Au back contacts (FIG. 24A). Cross sectional SEM images (FIG. 24B) before, (FIG. 24C) after 3 J/cm² and (FIG. 24D) 3.5 J/cm² treatment. Spatial SEM (FIG. 24E) and spatial EDS maps of film after 3.5 J/cm² pulse (FIG. 24F-G) are shown. Composite EDS response for Cu, In, Se, Au and Si (FIG. 24F). Au EDS response showing Au agglomeration scattered across the substrate (FIG. 24G).

Photonic curing of $CuInSe_2$ nanocrystals on Au-coated soda lime glass. Photonic curing of $CuInSe_2$ nanocrystals on Au-coated soda lime glass was tested. Au has been a better back contact than Mo for spray-deposited $CuInSe_2$ nanocrystal films since it has a higher work function than Mo, making it more suitable to form Ohmic contact with the p-type $CuInSe_2$ layer (Akhavan, V. A. et al., "Thickness-limited Performance of $CuInSe_2$ Nanocrystal Photovoltaic Devices," *Opt. Express* 2010, 18, A411-A420). FIGS. 24A-G show XRD and SEM images of the nanocrystal film after photonic curing at 3 and 3.5 $J/cm^2$. At both energy inputs, the (112) diffraction peaks are significantly narrowed after curing. Cross sectional SEM images of films photoannealed at 3 $J/cm^2$ show necking of the nanocrystals (FIG. 24B) with no loss in integrity of the 40 nm Au back contact. Higher pulse energy, 3.5 $J/cm^2$ pulse, was required to fully sinter the $CuInSe_2$ nanocrystal layer, but these conditions destroyed the Au back contact (FIG. 24D). FIGS. 24E-24G show an EDS map of the nanocrystal film after 3.5 J/cm² curing with agglomerates of Au peeking through the CuInSe₂ film.

Figure 25:
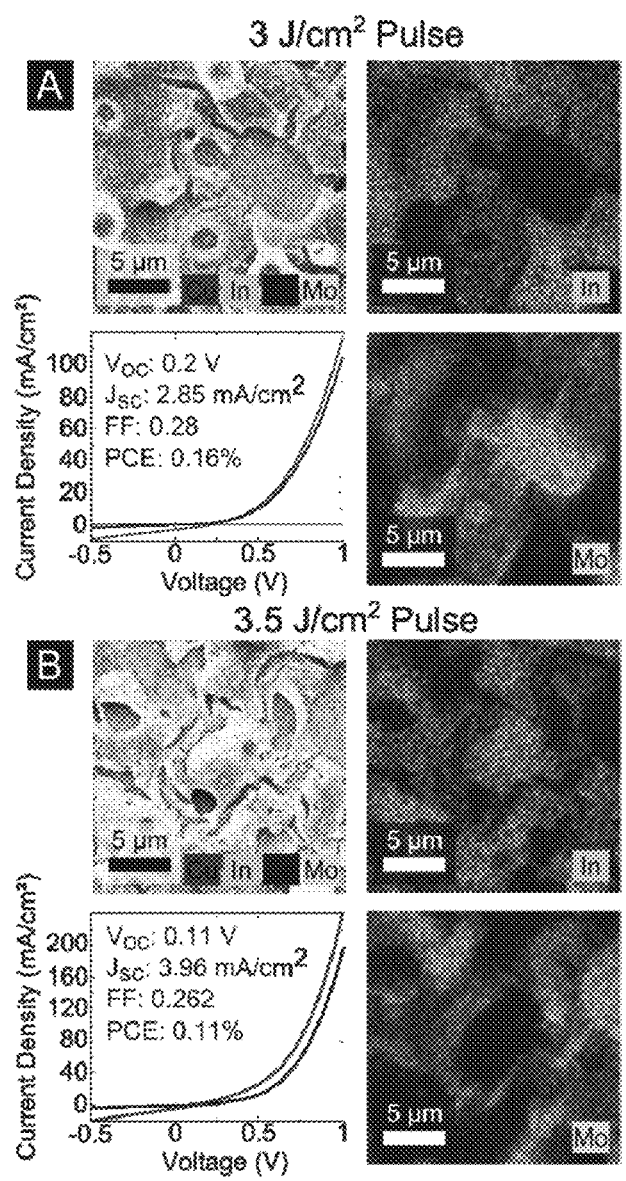
FIGS. 25A-25B show EDS maps and IV curves of sintered CIS film on MoSe₂/Mo back contacts with pulse energies of 3 J/cm² (FIG. 25A) and 3.5 J/cm² (FIG. 25B). Cu, In, Se, and Mo composite response (top left), green In EDS response (top right) showing absorber layer location, and light blue Mo EDS response (bottom right) showing exposed back contact; and IV response (bottom left) for devices with each pulse condition.

Table 2 summarizes the performance of devices made with nanocrystal films after photonic curing. Untreated devices on Au have higher efficiencies compared to those on MoSe₂/Mo. Devices made after light annealing on back contacts of both Au and MoSe₂/Se suffer from low $V_{oc}$ due to exposed back contact. In comparison with untreated nanocrystal films, $J_{sc}$ values are slightly lower for both MoSe₂/Mo and Au for a 3 J/cm² pulse. $J_{sc}$ improves on MoSe₂/Mo from 3.2 to 4.0 mA/cm² when a nanocrystal film is pulsed with 3.5 J/cm². Additionally, due to exposed back contact, active CuInSe₂ area is smaller in the light-annealed films than as-deposited nanocrystal films. FIG. 25 shows EDS maps from the 3 and 3.5 J/cm² pulse of films on MoSe₂/Mo back contacts. Sintered absorber layer is shown in the green In EDS Maps (top right), while dark areas in the In maps and bright areas in the Mo EDS maps (bottom right) have no sintered CuInSe₂ absorber layer and would not contribute to the short circuit current. Correcting $J_{sc}$ values for the reduced active area of the device in pulsed films would increase short circuit current values, highlighting the potential of this technique for increased device performance with improved sintered layers. Films treated with 3.5 J/cm² pulses on Au did not have any measureable device current due to Au back contact destruction.

TABLE 2

| Energy Input (J/cm2) | Back Contact | Voc (V) | Jsc (mA/cm2) | FF | PCE (%) |
|---|---|---|---|---|---|
| No Pulse | MoSe2/Mo | 0.37 | 3.19 | 0.46 | 0.55 |
| 2.2 | MoSe2/Mo | 0.30 | 10.6 | 0.34 | 1.05 |
| 2.5 | MoSe2/Mo | 0.16 | 1.78 | 0.29 | 0.08 |
| 3 | MoSe2/Mo | 0.20 | 2.85 | 0.28 | 0.16 |
| 3.5 | MoSe2/Mo | 0.11 | 3.96 | 0.26 | 0.11 |
| No Pulse | Au | 0.41 | 5.65 | 0.49 | 1.19 |
| 2.2 | Au | 0.21 | 18.25 | 0.32 | 1.25 |
| 2.5 | Au | 0.21 | 12.87 | 0.31 | 0.85 |
| 3 | Au | 0.05 | 4.82 | 0.24 | 0.06 |
| 3.5 | Au | — | — | — | — |

Figure 26:
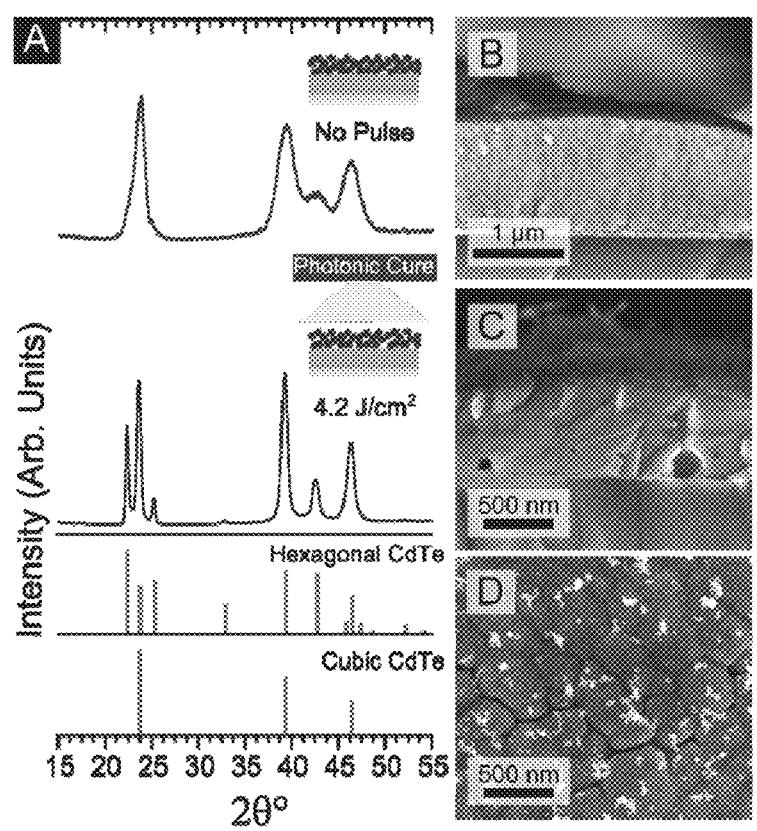
FIGS. 26A-26D show (FIG. 26A) XRD of CdTe nanocrystal films on glass before and after photonic curing (4.2 J/cm²), (FIG. 26B) Cross-sectional SEM of a CdTe film before photonic curing showing nanocrystal-sized grains, (FIG. 24C-D) Cross-sectional and spatial SEM of a CdTe film after photonic curing.

Photonic Curing of CdTe Nanocrystal Films. Photonic curing of CdTe nanocrystals on ITO-coated glass was also studied. CdTe nanocrystals on ITO-coated glass sintered at 350-400° C. have reached device efficiencies higher than 7% (MacDonald, B. I. et al., "Layer-by-Layer Assembly of Sintered CdSe$_x$Te$_{1-x}$ Nanocrystal Solar Cells," *ACS Nano* 2012, 6, 5995-6004). CdTe nanocrystals were sintered under ambient atmosphere, whereas CIGS requires a selenium-rich atmosphere to prevent Se loss and promote grain growth. FIGS. 26A-26D show XRD and SEM data of a CdTe nanocrystal film before and after photocuring with a 4.2 J/cm² pulse. Significant grain growth is observed, as shown by the narrowing of the XRD peaks (FIG. 26A). This is confirmed by SEM, which shows a film initially comprised of nanocrystalline grains (FIG. 26B) converted into very large CdTe grains after photonic curing (FIGS. 26C, 26D). Some film dewetting occurs, likely due to the rapid escape of the organic capping ligands during photonic curing. Photonoic curing also changed the crystal structure of the CdTe nanocrystal films from zinc blende to wurtzite.

Energy Input Threshold for Sintering and Hexagonal Phase Conversion of CuInSe₂ and CdTe Nanocrystal Films.

Figure 27:
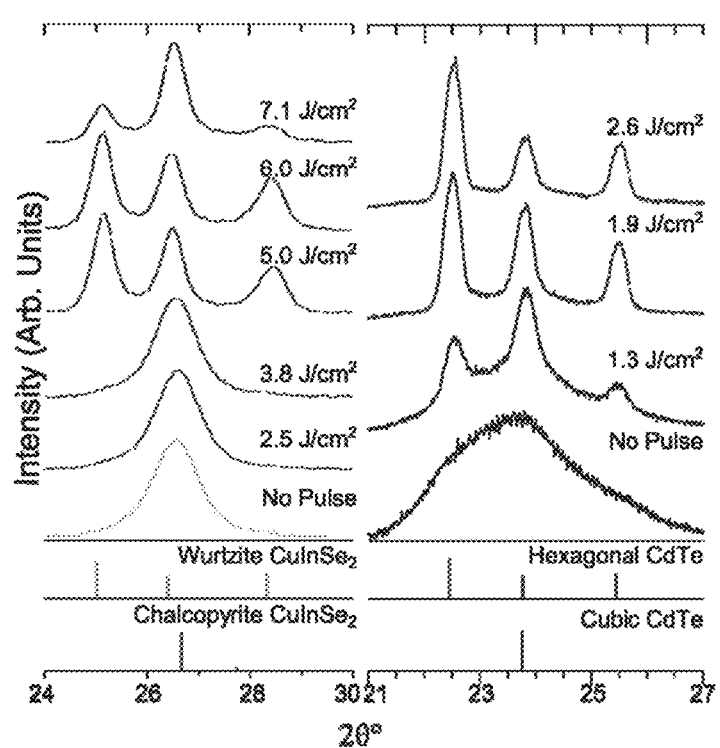
FIGS. 27A-27B show-XRD data showing wurtzite formation of (FIG. 24A) CIS nanocrystal films on Mo which have been annealed for 1 hr under Ar and (FIG. 24B) CdTe on ITO after photonic curing at various pulse conditions.

FIGS. 27A-27B show XRD data of CuInSe₂ and CdTe nanocrystal films cured under different pulse conditions. The CuInSe₂ films were pre-treated with a 1 hr anneal in Ar at 475° C., followed by photonic curing with 160 μs pulses with energies from 1.3 to 7.2 J/cm² to determine the threshold for sintering and wurtzite formation. Above a pulse of 5 J/cm² both peak narrowing and wurtzite formation are observed. As voltage is increased, the films continue to exhibit wurtzite structure but with increasing chalcopyrite phase presence. Pulsing at 7.2 J/cm² led to Mo delamination.

FIG. 27B shows XRD data for CdTe nanocrystal films after photonic curing at various pulse energies. The CdTe films have a much lower pulse power threshold to induce sintering. CdTe films with the hexagonal phase form when pulse energy exceeds 1.3 J/cm² in contrast to 5 J/cm² for CIS films. CdTe films also display mixed phases after sintering, although in contrast to the CIS films, CdTe exhibits more hexagonal character with increasing pulse energy.

Photonic curing can result in transient heating of the films to high temperature to rapid nanocrystal sintering. Due to microsecond pulse durations, actual sintering time can be within the same regime but can depend on the cooling rate of the films. Rapid pulse sintering can reduce the likelihood of Se loss by outgassing and the need for Se vapor in the process. During pulsing, large thermal gradients can be generated, allowing the nanocrystal film to reach high temperatures while the underlying back contact remains at a lower temperature. The temperature gradient in the film can depend on the optical absorption of the nanocrystals and the thermal conductivity and thickness of the underlying layers.

CuInSe₂ and CdTe nanocrystal films can be sintered using microsecond pulses at room temperature without vacuum. Photonic curing can result in sintered CIS and CdTe photovoltaic thin films on a variety of back contacts that were used to fabricate photovoltaic devices. Interestingly, these films experienced changes in crystal phase: CIS transitioned from chalcopyrite to wurtzite, and CdTe films transitioned from cubic to hexagonal.

Example 5: Raman Spectroscopy

Sintering of CuInSe₂ nanocrystals by photonic curing can give a unique Raman signal.

Figure 28:
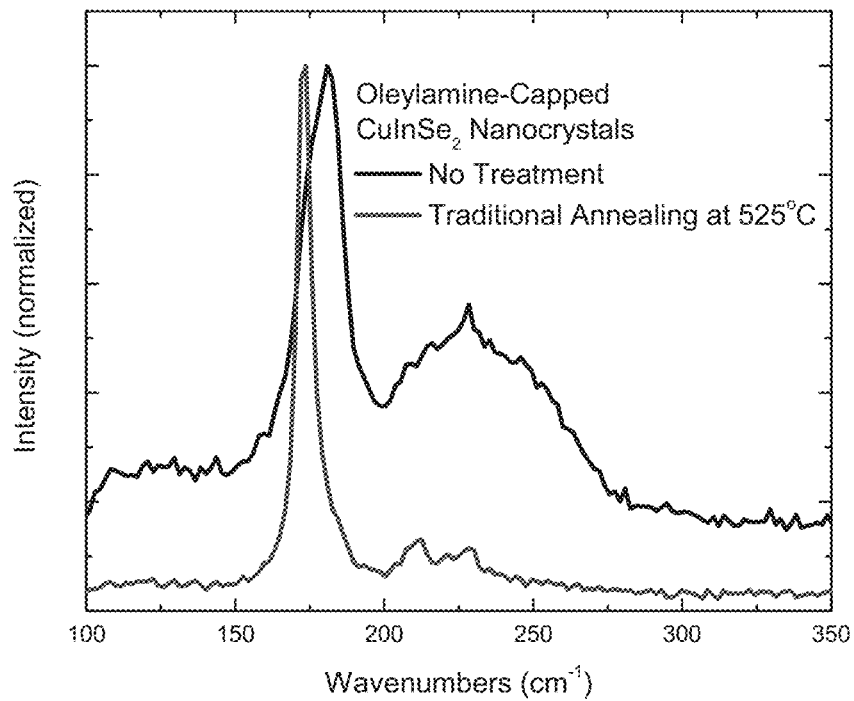
FIG. 28 shows Raman spectra for oleylamine-capped CuInSe₂ nanocrystal films with no treatment and after traditional thermal annealing at 525° C. The primary A1 mode for CuInSe₂ shifts by ~5 cm⁻¹ from 180 cm⁻¹ to 175 cm⁻¹ after annealing. Annealing also greatly reduces the relative intensity of the Raman signal in the range of 200-275 cm⁻¹, which is called the "disorder band".
Figure 29:
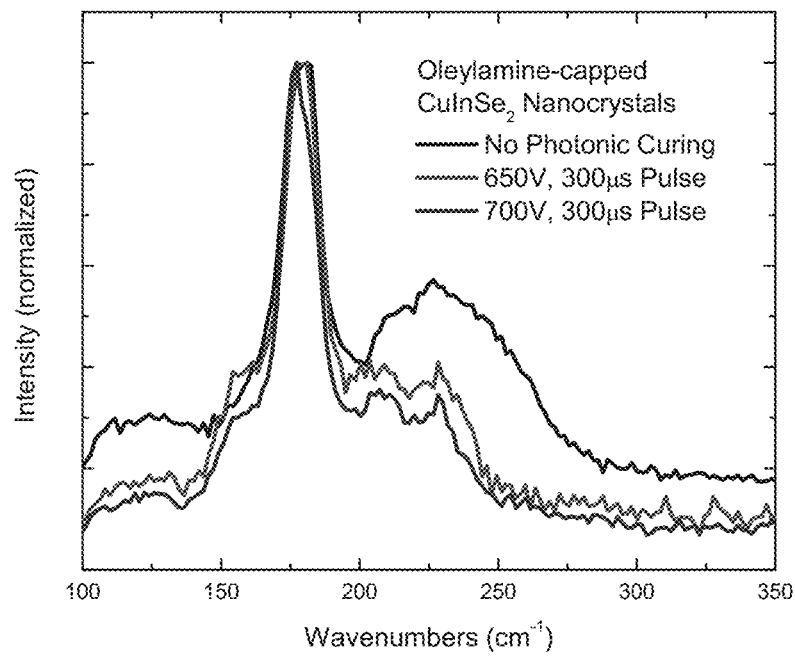
FIG. 29 shows Raman spectra for oleylamine-capped CuInSe₂ nanocrystal films sintered with photonic curing.

Sintering of CuInSe₂ nanocrystals by traditional thermal annealing shifts the primary A1 mode for CuInSe₂ by ~5 cm⁻¹ from 180 cm⁻¹ to 175 cm⁻¹. It also greatly reduce the relative intensity of the band of modes in the range of 200-275 cm⁻¹, which is called the "disorder band" (see FIG. 28). Whereas, sintering of CuInSe₂ nanocrystals by photonic curing does not cause a significant shift in the location of the primary A1 mode, but does lead to a reduction in the relative intensity of the disorder band (see FIG. 29).

Additional aspects of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

What is claimed is:
1. A layered structure, comprising:
   a semiconductor layer comprising a film of unsintered or partially sintered nanocrystals substantially free of capping ligands, wherein the semiconductor layer exhibits individual nanocrystal grains of nanometer-scale dimensions in electrical contact with one another; and
   a first electrode.

2. The layered structure of claim 1, further comprising a second electrode and a second semiconductor layer different from the semiconductor layer, wherein the first electrode and the second electrode sandwich the semiconductor layer and the second semiconductor layer.

3. The layered structure of claim 2, wherein at least one of the first and second electrodes comprises a transparent conductive layer.

4. The layered structure of claim 2, wherein at least one of the first and second electrodes comprises a reflective metal.

5. The layered structure of claim 1, wherein the nanocrystals are partially fused together to form the individual grains of nanometer-scale dimensions in electrical contact with one another.

6. The layered structure of claim 1, wherein the individual grains have an average size of from about 0.1 nm to about 100 nm.

7. The layered structure of claim 1, wherein the nanocrystals comprise nanocrystals irradiated with one or more pulses of light for removal of capping ligands.

8. The layered structure of claim 1, wherein the nanocrystals comprise nanocrystals irradiated with one or more pulses of light from a flash lamp.

9. The layered structure of claim 1, comprising a photovoltaic device.

10. The layered structure of claim 1, comprising one or more Au, $CuInSe_2$, CdS, ZnO, or ITO films.

11. The layered structure of claim 1, comprising one or more Mo, $MoSe_2$, $CuInSe_2$, CdS, ZnO, or ITO films.

12. The layered structure of claim 1, further comprising a substrate supporting the semiconductor layer and the first electrode, wherein the substrate is selected from the group consisting of glass, nanowire, nanotube, quartz, metal alloy, and metal foil.

13. The layered structure of claim 1, further comprising a substrate supporting the semiconductor layer and the first electrode, wherein the substrate comprises plastic, paper, or polymer material.

14. The layered structure of claim 1, comprising a photovoltaic device exhibiting a peak external quantum efficiency exceeding 100%, wherein the photovoltaic device comprises:
    the first electrode;
    the semiconductor layer, wherein the nanocrystals comprise CdTe, $CuInSe_2$, $CuInS_2$, $CuIn_xGa_{1-x}Se_2$, $CnInTe_2$, $CuGa_xIn_{1-x}Te_2$, $CuGa_xIn_{1-x}Te_2$, $Cu_2ZnSnS_2$, $Cu_2ZnSnS_4$, $Cu_2ZnSnSe_4$ or $Cu(In_xGa_{1-x})Se_2$, where x is from 0 to 1;
    a second semiconductor layer, wherein the second semiconductor layer is different from the semiconductor layer; and
    a second electrode, wherein the semiconductor layer and the second semiconductor layer are between the first electrode and the second electrode.

15. The layered structure of claim 1, comprising a photovoltaic device exhibiting a peak external quantum efficiency under white light bias of from 100% to 127%, wherein the photovoltaic device comprises:
    the first electrode;
    the semiconductor layer, wherein the nanocrystals comprise CdTe, $CuInSe_2$, $CuInS_2$, $CuIn_xGa_{1-x}Se_2$, $CnInTe_2$, $CuGa_xIn_{1-x}Te_2$, $CuGa_xIn_{1-x}Te_2$, $Cu_2ZnSnS_2$, $Cu_2ZnSnS_4$, $Cu_2ZnSnSe_4$ or $Cu(In_xGa_{1-x})Se_2$, where x is from 0 to 1;
    a second semiconductor layer, wherein the second semiconductor layer is different from the semiconductor layer; and
    a second electrode, wherein the semiconductor layer and the second semiconductor layer are between the first electrode and the second electrode.

16. The layered structure of claim 1, wherein the semiconductor layer exhibits a composition gradient from one side of the semiconductor layer to another side of the semiconductor layer.

17. The layered structure of claim 1, comprising a semiconductor junction device.

* * * * *